United States Patent
Cao et al.

(10) Patent No.: US 11,233,155 B2
(45) Date of Patent: Jan. 25, 2022

(54) THIN FILM TRANSISTOR AND FABRICATION METHOD THEREOF, ARRAY SUBSTRATE AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Binbin Cao, Beijing (CN); Lin Sun, Beijing (CN); Chao Wang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 816 days.

(21) Appl. No.: 16/067,366

(22) PCT Filed: Nov. 29, 2017

(86) PCT No.: PCT/CN2017/113574
§ 371 (c)(1),
(2) Date: Jun. 29, 2018

(87) PCT Pub. No.: WO2018/201709
PCT Pub. Date: Nov. 8, 2018

(65) Prior Publication Data
US 2021/0210621 A1   Jul. 8, 2021

(30) Foreign Application Priority Data

May 4, 2017 (CN) .......................... 201710308737.3

(51) Int. Cl.
*H01L 29/786* (2006.01)
*H01L 29/66* (2006.01)

(52) U.S. Cl.
CPC .. *H01L 29/78696* (2013.01); *H01L 29/66742* (2013.01); *H01L 29/78618* (2013.01); *H01L 29/78633* (2013.01)

(58) Field of Classification Search
CPC ......... H01L 21/02104; H01L 21/02656; H01L 21/02664; H01L 21/02675;
(Continued)

(56) References Cited

U.S. PATENT DOCUMENTS 5,981,974 A * 11/1999 Makita .............. H01L 21/02532
257/72
9,142,425 B2    9/2015 Ando
(Continued)

FOREIGN PATENT DOCUMENTS

| CN | 102064109 A | 5/2011 |
| CN | 102157386 A | 8/2011 |

(Continued)

OTHER PUBLICATIONS

Jun. 20, 2019—(CN) First Office Action Appn 201710308737.3 with English Translation.
(Continued)

*Primary Examiner* — Cheung Lee
(74) *Attorney, Agent, or Firm* — Banner & Witcoff, Ltd.

(57) ABSTRACT

A fabrication method of a thin film transistor is provided. The fabrication method includes: forming a gate electrode, an active layer, a drain electrode and a source electrode on the base substrate, in which the active layer includes a channel region and a second portion on both sides of the channel region, and at least a portion of the channel region is overlapped with the gate electrode; and performing a laser annealing process on a side of the base substrate by using a laser, in which the channel region is shielded without being irradiated by the laser, a resistivity of the second portion of
(Continued)

the active layer is lower than a resistivity of the channel region, and the second portion of the active layer is connected with the source electrode and the drain electrode. A thin film transistor, an array substrate and a display device are further provided.

8 Claims, 20 Drawing Sheets

(58) Field of Classification Search
CPC ........... H01L 21/02691; H01L 27/1214; H01L 27/1222; H01L 27/1259; H01L 27/127; H01L 27/1285; H01L 29/40; H01L 29/401; H01L 29/49; H01L 29/4908; H01L 29/66; H01L 29/66007; H01L 29/66409; H01L 29/66742; H01L 29/76; H01L 29/772; H01L 29/78; H01L 29/786; H01L 29/78618; H01L 29/78633; H01L 29/78642; H01L 29/78696; H01L 28/66742
See application file for complete search history.

(56) References Cited

U.S. PATENT DOCUMENTS

| | | | |
|---|---|---|---|
| 2009/0256172 A1* | 10/2009 | Lim | ............... H01L 29/66757 257/101 |
| 2009/0294964 A1 | 12/2009 | Higashi et al. | |
| 2012/0231588 A1* | 9/2012 | Chiang | ............... H01L 29/7869 438/158 |
| 2015/0017761 A1* | 1/2015 | Ando | ............... H01L 29/66969 438/104 |
| 2016/0013222 A1 | 1/2016 | Park et al. | |

FOREIGN PATENT DOCUMENTS

| | | |
|---|---|---|
| CN | 104282768 A | 1/2015 |
| CN | 106876481 A | 6/2017 |

OTHER PUBLICATIONS

Feb. 14, 2018—(WO) International Search Report and Written Opinion Appn PCT/CN2017/113574 with English Translation.

* cited by examiner

THIN FILM TRANSISTOR AND FABRICATION METHOD THEREOF, ARRAY SUBSTRATE AND DISPLAY DEVICE

The application is a U.S. National Phase Entry of International Application No. PCT/CN2017/113574 filed on Nov. 29, 2017, designating the United States of America and claiming priority to Chinese Patent Application No. 201710308737.3 filed on May 4, 2017. The present application claims priority to and the benefit of the above-identified applications and the above-identified applications are incorporated by reference herein in their entirety.

TECHNICAL FIELD

Embodiments of the present disclosure relate to a thin film transistor and a fabrication method thereof, an array substrate and a display device.

BACKGROUND

With the development of display devices, a demand for an oxide active layer is getting higher and higher. Compared with amorphous silicon (a-Si) materials, an oxide semiconductor for forming the oxide active layer has advantages of a high carrier mobility, a low preparation temperature, a high uniformity of large area, a high optical transmittance and the like. These advantages determine that an oxide thin film transistor (TFT) comprising the oxide active layer is suitable for preparation of a high resolution thin film transistor liquid crystal display (TFT-LCD), an active matrix organic light-emitting diode display (AM-OLED), a flexible display device, a transparent display device and other display devices.

SUMMARY

According to embodiments of the disclosure, a fabrication method of a thin film transistor is provided. The method comprises: providing a base substrate; forming a gate electrode, an active layer, a source electrode and a drain electrode on the base substrate, in which the active layer comprises a channel region and a second portion on both sides of the channel region, and at least a portion of the channel region is overlapped with the gate electrode; and performing a laser annealing process on a side of the base substrate by using a laser, in which the channel region is shielded and not irradiated by the laser, and a resistivity of the second portion of the active layer is lower than a resistivity of the channel region. The second portion of the active layer is connected with the source electrode and the drain electrode.

For example, the thin film transistor is a bottom-gate type thin film transistor, and the laser annealing process is performed on a side of the base substrate which is not provided with the active layer by using the gate electrode as a mask.

For example, the thin film transistor is a bottom-gate type thin film transistor; and the fabrication method further comprises: forming a shielding layer that is overlapped with at least a portion of the channel region on a side of the active layer facing away from the base substrate; and performing the laser annealing process on a side of the base substrate provided with the active layer by using the shielding layer as a mask.

For example, the thin film transistor is a top-gate type thin film transistor, and the laser annealing process is performed on a side of the base substrate provided with the active layer by using the gate electrode as a mask.

For example, the thin film transistor is a top-gate type thin film transistor; and the fabrication method further comprises: forming a shielding layer that is overlapped with at least a portion of the channel region on a side of the active layer facing the base substrate; and performing the laser annealing process on a side of the base substrate which is not provided with the active layer by using the shielding layer as a mask.

For example, the fabrication method of the thin film transistor further comprises: forming an etching stop layer on the active layer before forming the source electrode and the drain electrode.

For example, the fabrication method of the thin film transistor further comprises: forming an insulating layer on the source electrode and the drain electrode, wherein the laser annealing process is performed after the insulating layer is formed on the source electrode and the drain electrode.

For example, the laser annealing process is performed after the source electrode and the drain electrode are formed.

For example, the laser annealing process is performed after the active layer is formed and before the source electrode and the drain electrode are formed.

For example, the laser annealing process is performed after the etching stop layer is formed and before the source electrode and the drain electrode are formed.

For example, the laser annealing process is an excimer laser annealing process or a continuous oscillation laser annealing process.

For example, an energy of the laser is from 100 mj/cm2 to 300 mj/cm2 during performing the laser annealing process.

According to the embodiments of the disclosure, a thin film transistor is provided. The thin film transistor comprises: a gate electrode, an active layer, a source electrode and a drain electrode disposed on a base substrate. The active layer comprises a channel region and a second portion, at least a portion of the channel region is overlapped with the gate electrode, and the second portion is not overlapped with the gate electrode; a laser annealing process is performed on the second portion so that a resistivity of the second portion of the active layer is lower than a resistivity of the channel region; the second portion of the active layer is connected with the source electrode and the drain electrode.

For example, the thin film transistor is a bottom-gate type thin film transistor.

For example, the thin film transistor further comprises: a shielding layer, arranged on a side of the active layer facing away from the base substrate and overlapped with at least a portion of the channel region.

For example, the thin film transistor is a top-gate type thin film transistor.

For example, the thin film transistor further comprises: a shielding layer, arranged on a side of the active layer facing the base substrate and overlapped with at least a portion of the channel region.

For example, the thin film transistor further comprises: an etching stop layer arranged on the active layer.

According to the embodiments of the disclosure, an array substrate is provided. The array substrate comprises the thin film transistor as described above.

According to the embodiments of the disclosure, a display device is provided. The display device comprises the array substrate as described above.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

Figure 1A:
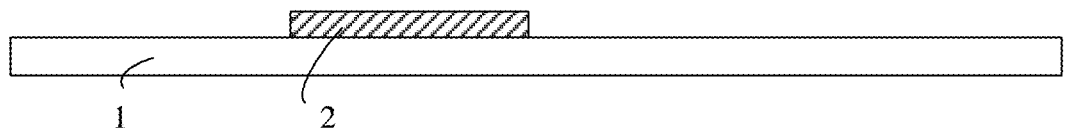
FIG. 1a to FIG. 1g are schematic diagrams of a manufacturing method of a bottom-gate type thin film transistor provided by at least one embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The terms "in," "out," "on," "under" and the like are only used to indicate relative position relationship, and when the position of an object is described as being changed, the relative position relationship may be changed accordingly.

Thicknesses of the films or regions in the drawings of the present disclosure do not reflect true proportions, and the drawings are magnified or reduced. The drawings of the embodiments of the present disclosure only relate to structures related to the embodiments of this disclosure, and other structures may refer to a usual design.

At least one embodiment of the present disclosure provides a fabrication method of a thin film transistor, and the fabrication method comprises: providing a base substrate; forming a gate electrode, an active layer, a source electrode and a drain electrode on the base substrate, in which the active layer comprises a channel region and a second portion on both sides of the channel region, and at least a portion of the channel region is overlapped with the gate electrode; and performing a laser annealing process on a side of the base substrate by using a laser, in which the channel region is shielded and not irradiated by the laser, and a resistivity of the second portion of the active layer is lower than a resistivity of the channel region, and in which the second portion of the active layer is connected with the source electrode and the drain electrode.

At least one embodiment of the present disclosure further provides a thin film transistor, the thin film transistor comprises: a gate electrode, an active layer, a source electrode and a drain electrode disposed on a base substrate; the active layer comprises a channel region and a second portion not overlapped with the gate electrode, and at least a portion of the channel region is overlapped with the gate electrode; a laser annealing process is performed on the second portion, and a resistivity of the second portion of the active layer is lower than a resistivity of the channel region; the second portion of the active layer is connected with the source electrode and the drain electrode.

At least one embodiment of the present disclosure further provides an array substrate, which comprises any one of the above mentioned thin film transistors.

At least one embodiment of the present disclosure further provides a display device, which comprises any one of the above mentioned array substrates.

The methods, the structures and technical effects related to the present disclosure are explained in detail by some embodiments.

At least one embodiment of the present disclosure provides a fabrication method of a thin film transistor, and the fabrication method comprises: providing a base substrate; forming a gate electrode, an active layer, a source electrode and a drain electrode on the base substrate, in which the active layer comprises a channel region and a second portion on both sides of the channel region, and at least a portion of the channel region is overlapped with the gate electrode; and performing a laser annealing process on a side of the base substrate by using a laser, in which the channel region is shielded and not irradiated by the laser, and a resistivity of the second portion of the active layer is lower than a resistivity of the channel region, and in which the second portion of the active layer is connected with the source electrode and the drain electrode.

Exemplarily, FIG. 1a to FIG. 1g are schematic diagrams of a manufacturing method of a bottom-gate type thin film transistor provided by at least one embodiment of the present disclosure. As illustrated in FIG. 1a, the manufacturing method comprises: providing a base substrate 1, forming a gate electrode thin film on the base substrate 1, and performing a patterning process on the gate electrode thin film to form a gate electrode 2. For example, the gate electrode thin film is formed by a magnetron sputtering method or a chemical vapor deposition method. For example, the base substrate 1 is a glass substrate, a plastic substrate or a quartz substrate.

In at least one embodiment of the present disclosure, for example, the material of the gate electrode 2 is a metal, such as a copper based metal. For example, the copper based metal is copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium alloy (Cu/Mo/Nb) and so on. For example, the material of the gate electrode 2 is a chromium based metal, such as chromium molybdenum alloy (Cr/Mo), chrome titanium alloy (Cr/Ti), chrome molybdenum titanium alloy (Cr/Mo/Ti), etc. However, the material of the gate electrode 2 is not limited to the kinds listed above.

In at least one embodiment of the present disclosure, the patterning process is a photolithography process, for example, the photolithography process comprises: coating a photoresist layer on a structural layer that required to be patterned, exposing the photoresist layer by a mask, developing the exposed photoresist layer to obtain a photoresist pattern, the structural layer is etched by using the photoresist pattern as mask, and then the photoresist pattern is removed optionally. For example, according to requirements, the patterning process is a screen printing method, an inkjet printing method and so on. The types of the patterning process are not limited in the embodiments.

Figure 1B:
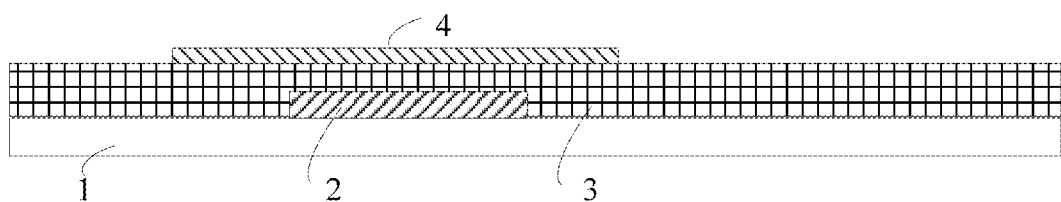

As illustrated in FIG. 1b, a gate insulating film is formed on the gate electrode 2, and a patterning process is performed on the gate insulating film to form a gate insulating layer 3. An active film is formed on the gate insulating layer 3, and a patterning process is performed on the active film to form an active layer 4. For example, the gate insulating film is formed by a coating method or a depositing method. For example, the active film is formed by a chemical vapor deposition method. The active layer 4 comprises a channel region 41 overlapped with the gate electrode 2 and a second portion 42 on both sides of the channel region 41. The second portion 42 of the active layer 4 is not overlapped with the gate electrode 2, that is, in a direction parallel to the base substrate 1, an area of the active layer 4 is larger than an area of the gate electrode 2.

In at least one embodiment, for example, the material of the gate insulating layer includes silicon nitride (SiNx), silicon oxide (SiOx), alumina ($Al_2O_3$), aluminum nitride (AlN), or other suitable materials.

In at least one embodiment, for example, the thin film transistor is an oxide thin film transistor, and the active layer is made of an oxide semiconductor material. For example, the oxide semiconductor material is indium gallium zinc oxide (IGZO), indium zinc oxide (IZO), Zinc Oxide (ZnO), gallium zinc oxide (GZO) or other metal oxides. However, the material of the active layer is not limited to the kinds mentioned-above.

Figure 1C:
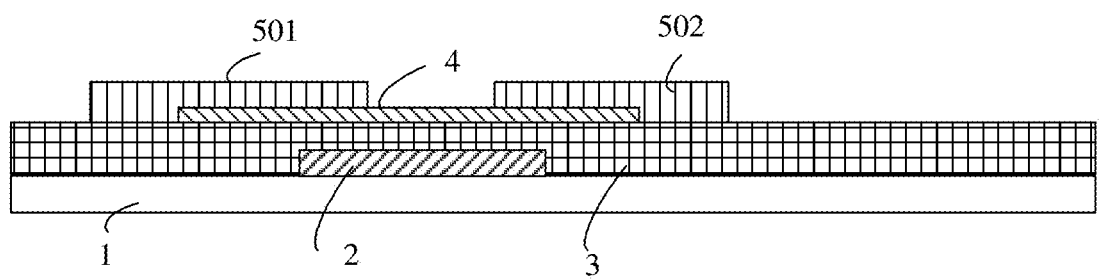

As illustrated in FIG. 1c, a source-drain electrode film is deposited on the active layer 4, and the source-drain electrode film is patterned to form a source electrode 501 and a drain electrode 502. The second portion 42 of the active layer 4 is electrically connected with the source electrode 501 and the drain electrode 502.

Figure 1D:
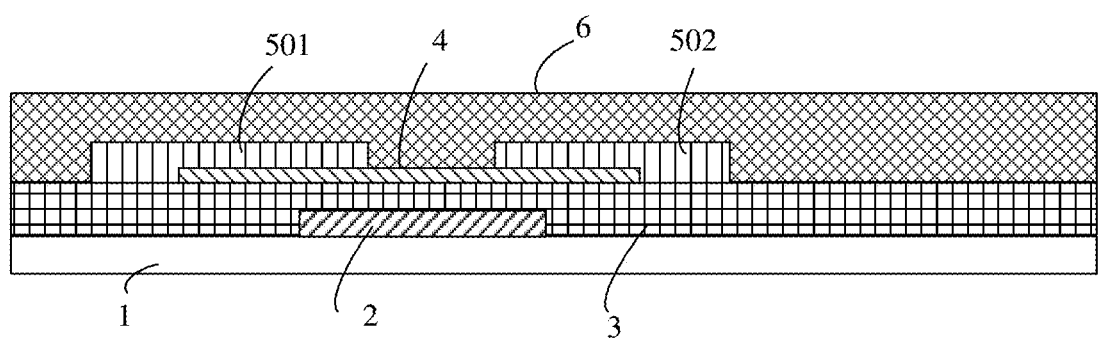
Figure 1E:
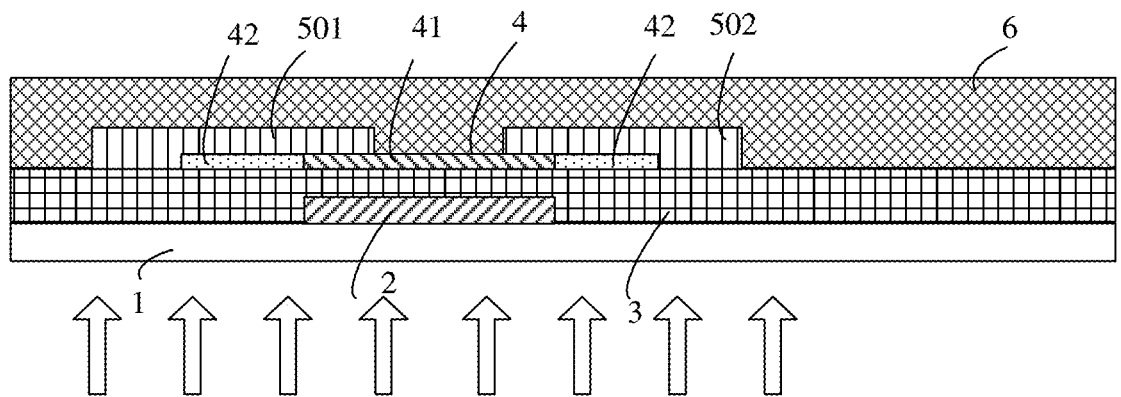

For example, a laser annealing process by using a laser is performed after an insulating layer is formed on the source electrode 501 and the drain electrode 502. As illustrated in FIG. 1d, the insulating layer 6 is formed on the source electrode 501 and the drain electrode 502. For example, the insulating layer 6 is formed by the coating method or the depositing method. For example, the material of the insulating layer 6 includes silicon oxide, nitride of silicon, nitrogen oxide of silicon, etc. Of course, the material of the insulating layer 6 is not limited to the kinds mentioned-above.

Figure 5A:
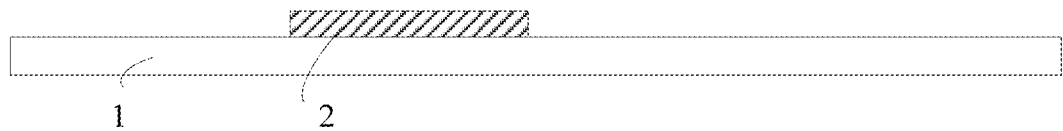
FIG. 5a to FIG. 5h are still another schematic diagrams of the manufacturing method of the bottom-gate type thin film transistor provided by at least one embodiment of the present disclosure.
Figure 5B:
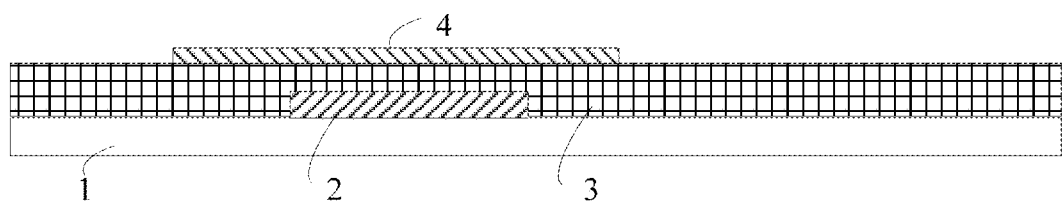
Figure 5C:
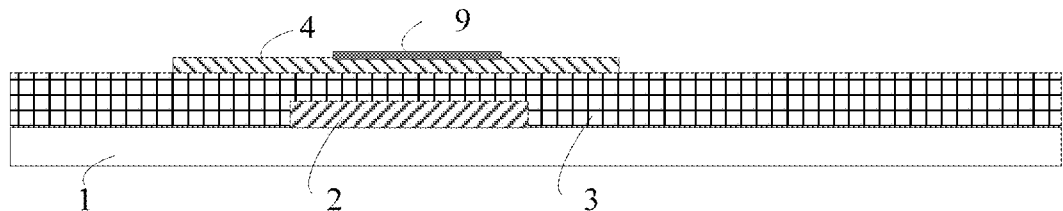
Figure 5D:
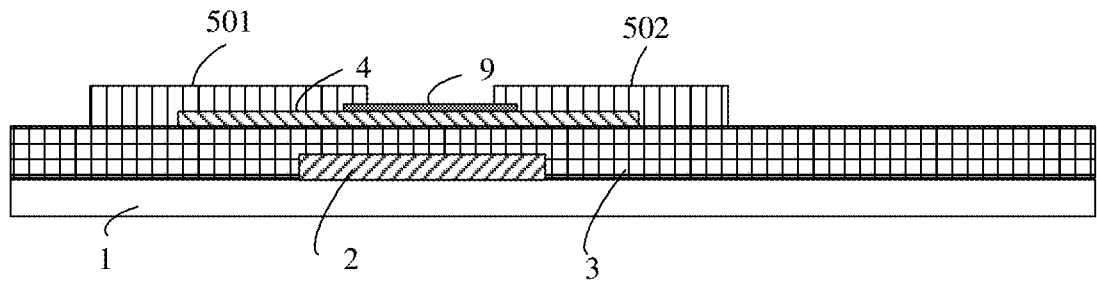
Figure 5E:
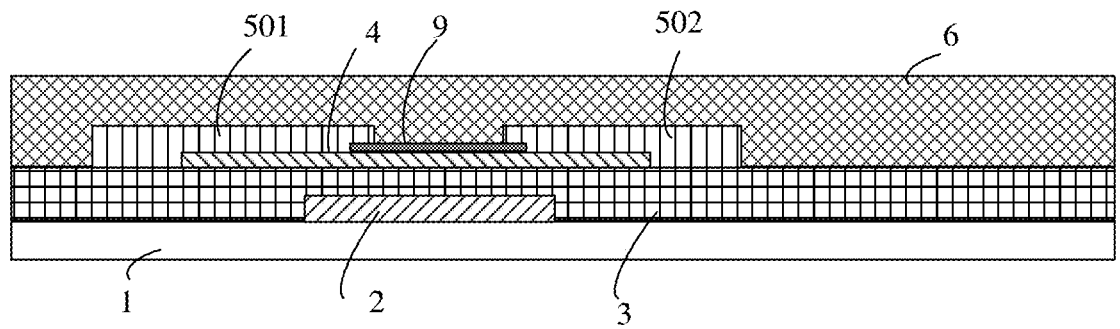
Figure 5F:
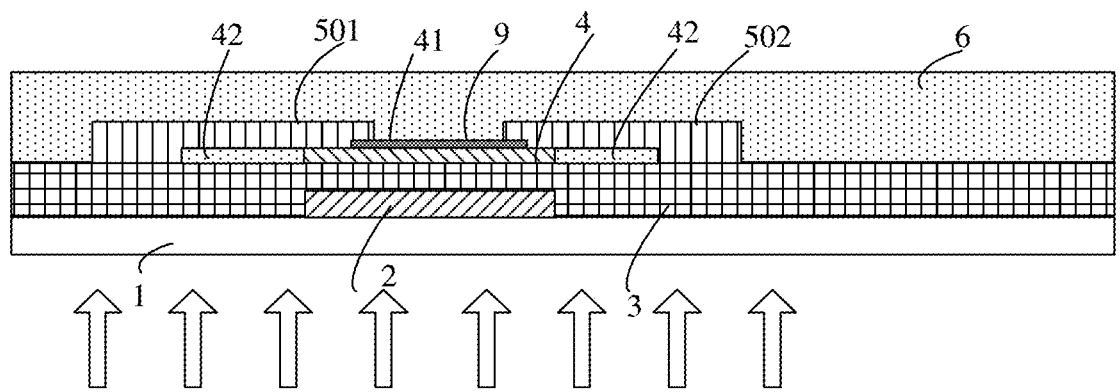

As illustrated in FIG. 5f, after the insulating layer 6 is formed, the laser annealing process is performed on the side of the base substrate without being disposed with the active layer 4 by using the gate electrode 2 as a mask. The channel region 41 of the active layer 4 is shielded, in this way, the channel region 41 is not irradiated by the laser, the resistivity of the channel region 41 varies little, which does not affect its property as a semiconductor with a high mobility; and the resistivity of the second portion 42 which is not shielded by the gate electrode 2 decreases sharply under a high energy laser irradiation and the second portion 42 tends to be conductive, so that the resistivity of the second portion 42 of the active layer 4 is lower than the resistivity of the channel region 41. In this way, a contact resistance between the active layer 4 and the source electrode 501 and between the active layer 4 and the drain electrode 502 is reduced significantly, thereby the resistance of the thin film transistor in a case of being turned on is reduced, and the technical effects of increasing an on state current, increasing a mobility and increasing a switching ratio of the thin film transistors are achieved, which improves a transmission velocity of the signal transmitted by the thin film transistor.

Compared with the case of performing the laser annealing process before forming the insulating layer 6, the case of performing the laser annealing process after the insulating layer 6 is formed has the following advantages:

(1) the source electrode 501 and the drain electrode 502 have a certain reflection effect on the high energy laser, so that an intensity of the laser irradiated on the active layer 4 is increased, which is more advantageous to reduce the resistance of the second portion 42 of the active layer 4.

(2) the insulating layer 6 has a function of heat preservation, which is more advantageous to increase the laser absorption amount of the active layer 4.

For the laser annealing process, for example, a wavelength of the laser is 200 nm to 350 nm, and the laser energy is 100 mj/cm$^2$ to 300 mj/cm$^2$. For example, in a case that the material of the active layer is indium gallium zinc oxide (IGZO), the resistivity of the second portion 42 of the active layer 4 is reduced by about 5 orders of magnitude after being laser-annealed with the laser with energy of 100-300 mj/cm$^2$. FIG. 1h is a curve diagram of a square resistance of indium gallium zinc oxide (IGZO) with a change of laser energy. The square resistance of IGZO is used to characterize its resistivity. As illustrated in FIG. 1h, in a case that the laser energy is 0 mj/cm$^2$ to 150 mj/cm$^2$, with the increasing of the laser energy, the decreasing amount of the square resistance of IGZO gradually increases; in a case that the laser energy is 150 mj/cm$^2$ to 300 mj/cm$^2$, difference of the decreasing amounts of the square resistance of IGZO is not significant but the decreasing amount is still large. It should be noted that, the laser processing parameters here are only examples, and other parameters may also be used as required.

Figure 1F:
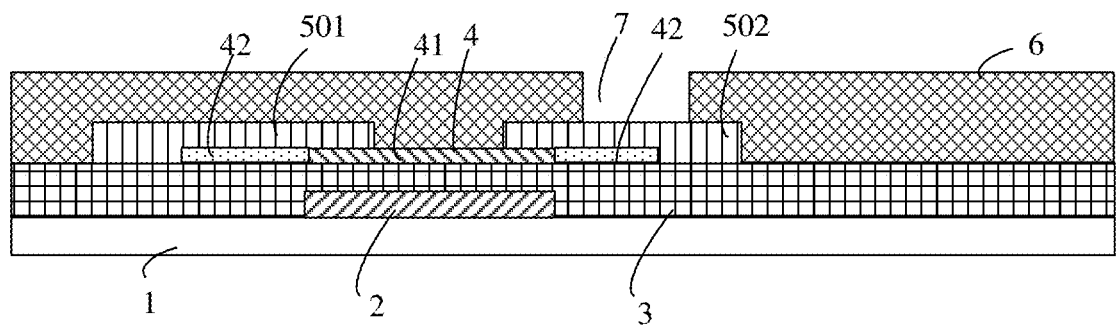

As illustrated in FIG. 1f, a via hole 7 is formed in the insulating layer 6. The via hole 7 exposes the drain electrode 502. For example, the via hole 7 is formed by a photolithography process.

Figure 1G:
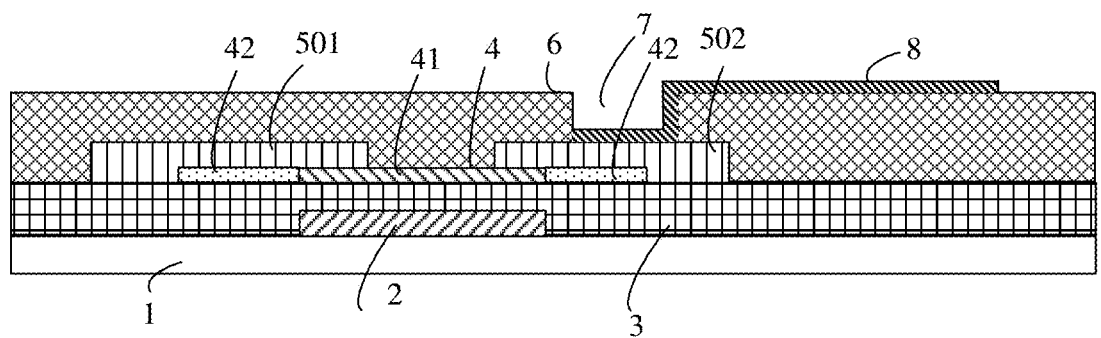
Figure 1H:
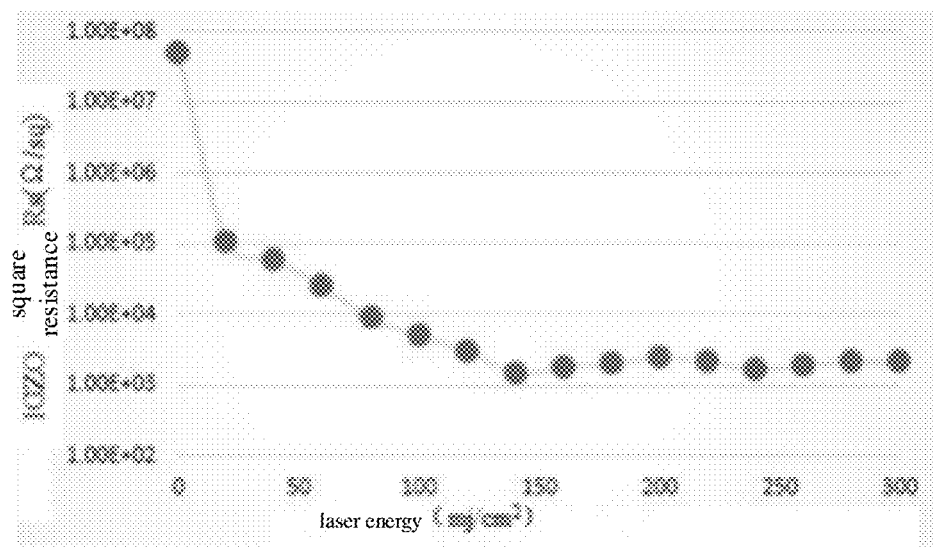
FIG. 1h is a curve diagram of a square resistance of indium gallium zinc oxide (IGZO) with a change of laser energy in the manufacturing method of the thin film transistor provided by at least one embodiment of the present disclosure.

As illustrated in FIG. 1g, a pixel electrode film is formed on the via hole 7 and the insulating layer 6, and the pixel electrode film is patterned to form a pixel electrode layer 8. For example, the pixel electrode film is formed by the magnetron sputtering method or the chemical vapor deposition method, for example, the photolithography process is used to pattern the pixel electrode film.

Figure 2:
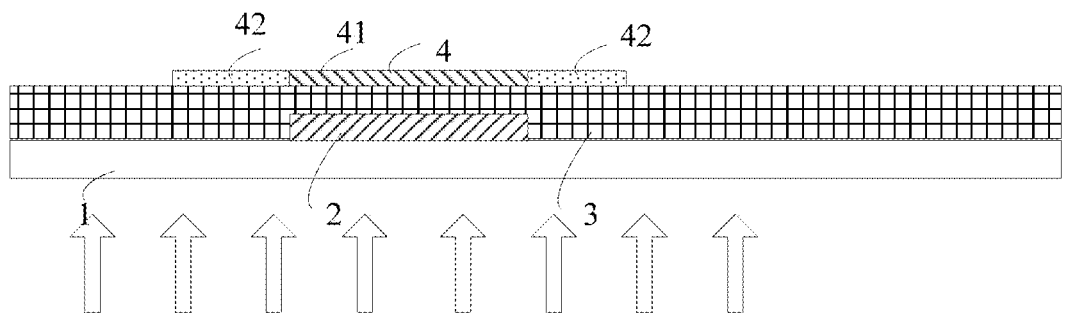
FIG. 2 is another schematic diagram of the manufacturing method of the bottom-gate type thin film transistor provided by at least one embodiment of the present disclosure.

In another example of the present embodiment, as illustrated in FIG. 2, after the active layer 4 is formed and before the source electrode 501 and the drain electrode 502 are formed, the laser annealing process is performed on the side of the base substrate without being disposed with the active layer 4 by using the gate electrode 2 as the mask. The other steps of the method shown in FIG. 2 are the same as those shown in FIG. 1a to FIG. 1g, and the method shown in FIG. 2 achieves similar technical effects as those shown in FIG. 1a to FIG. 1g.

Figure 3:
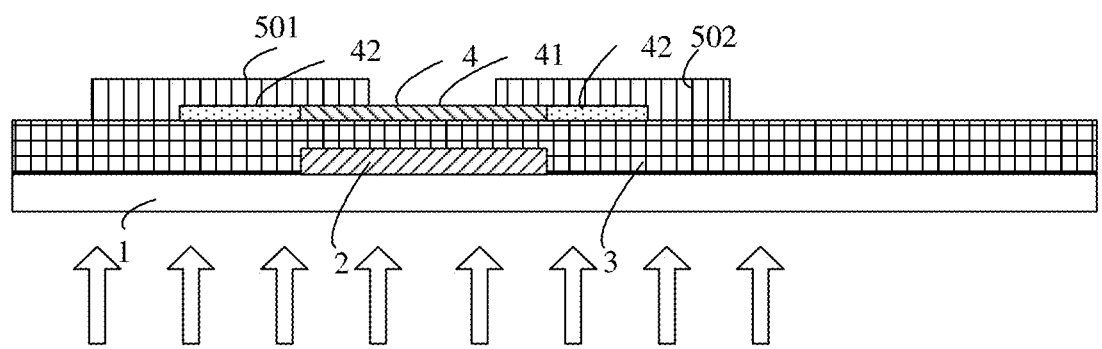
FIG. 3 is still another schematic diagram of the manufacturing method of the bottom-gate type thin film transistor provided by at least one embodiment of the present disclosure.

In another example of the present embodiment, as illustrated in FIG. 3, after the source electrode 501 and the drain electrode 502 are formed and before the insulating layer 6 is formed, the laser annealing process is performed on the side of the base substrate without being disposed with the active layer 4 by using the gate electrode 2 as the mask. The other steps of the method shown in FIG. 3 are the same as those shown in FIG. 1a to FIG. 1g, and the method shown in FIG. 3 achieves similar technical effects as those shown in FIG. 1a to FIG. 1g.

Figure 4A:
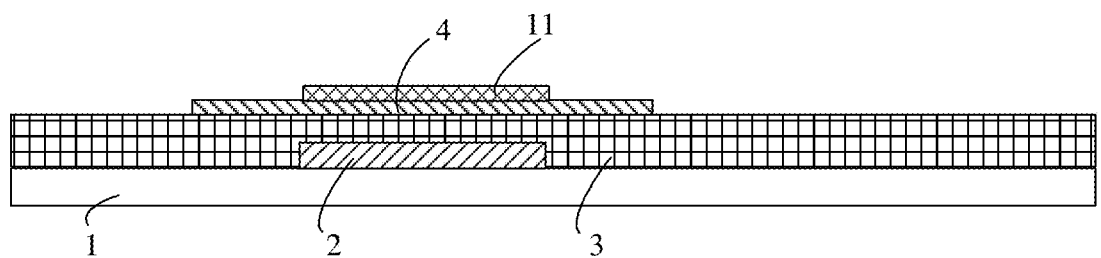
FIG. 4a to FIG. 4f are still another schematic diagrams of the manufacturing method of the bottom-gate type thin film transistor provided by at least one embodiment of the present disclosure.
Figure 4B:
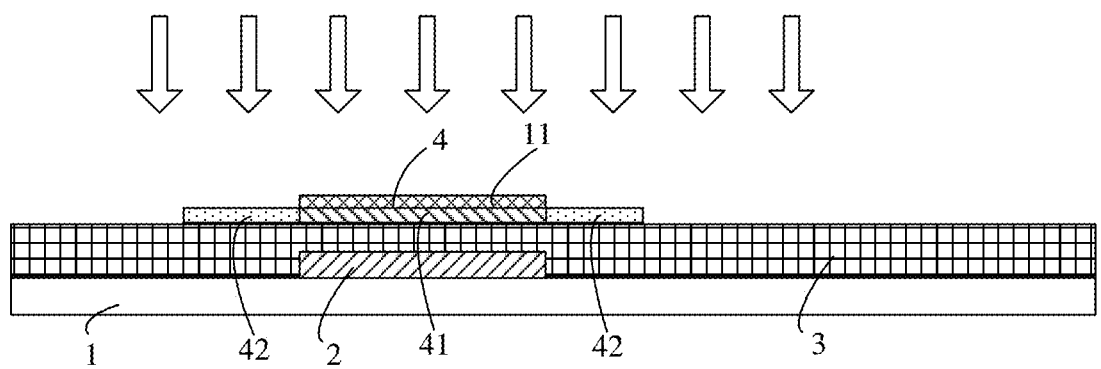

FIG. 4a to FIG. 4f are schematic diagrams of still another manufacturing method of the bottom-gate type thin film transistor provided by at least one embodiment of the present disclosure. As illustrated in FIG. 4a, the fabrication method further comprises: forming a shielding layer 11 that overlaps with at least a portion of the channel region 41 on the side of the active layer 4 facing away from the base substrate 1, and the shielding layer 11 is opaque. As illustrated in FIG. 4b, the laser annealing process is performed on the side of the base substrate 1 provided with the active layer 4, and the shielding layer 11 is used as the mask. This method enables that the channel region 41 of the active layer 4 is shielded by the shielding layer 11 without being irradiated by the laser, so that the resistivity of the channel region 41 varies little, which does not affect its property as the semiconductor with the high mobility; and the resistivity of the second portion 42 which is not shielded by the shielding layer 11 decreases sharply under the high energy laser irradiation and the second portion 42 tends to be conductive, so that the resistivity of the second portion 42 of the active layer 4 is lower than the resistivity of the channel region 41. This method achieves a same or a similar technical effect as shown in FIG. 1a to FIG. 1g.

It should be noted that, in at least one embodiment of the present disclosure, for example, the material of the shielding layer is a metal, such as a copper based metal. For example, the copper based metal is copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium alloy (Cu/Mo/Nb) and so on. For example, the material of the shielding layer 11 is a chromium based metal, such as chromium molybdenum alloy (Cr/Mo), chrome titanium alloy (Cr/Ti), chrome molybdenum titanium alloy (Cr/Mo/Ti), etc. However, the material of the shielding layer is not limited to the kinds listed above, which is not limited here. For example, a shielding film is formed by the magnetron sputtering method or the chemical vapor deposition method, and then the shielding film is patterned to form the shielding layer. For example, the method further comprises: oxidizing the shielding layer 11 for example by oxygen plasma after the laser annealing process is performed, in order to prevent that the shielding layer 11 electrically connects the source electrode 501 with the drain electrode 502.

Figure 4C:
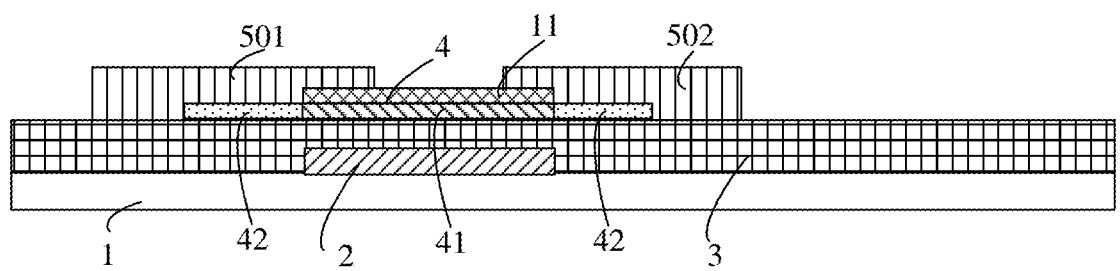

As illustrated in FIG. 4c, the source-drain electrode film is deposited on the active layer 4 and the shielding layer 11, and the source-drain electrode film is patterned to form the source electrode 501 and the drain electrode 502. The second portion 42 of the active layer 4 is electrically connected with the source electrode 501 and the drain electrode 502.

Figure 4D:
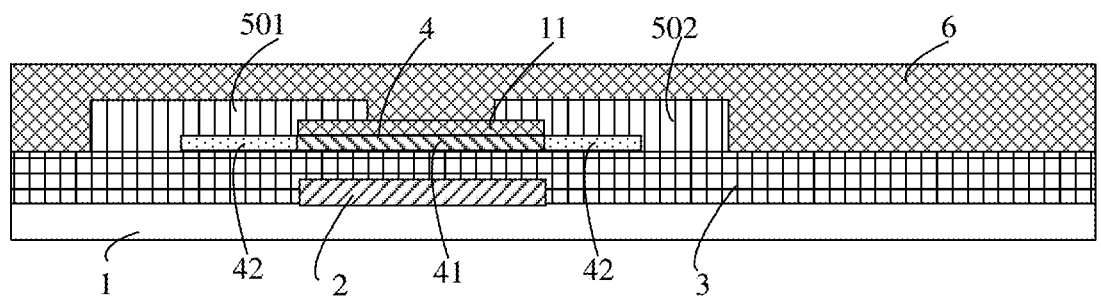

As illustrated in FIG. 4d, an insulating film is deposited on the source electrode 501 and the drain electrode 502, and the insulating film is patterned to form the insulating layer 6.

Figure 4E:
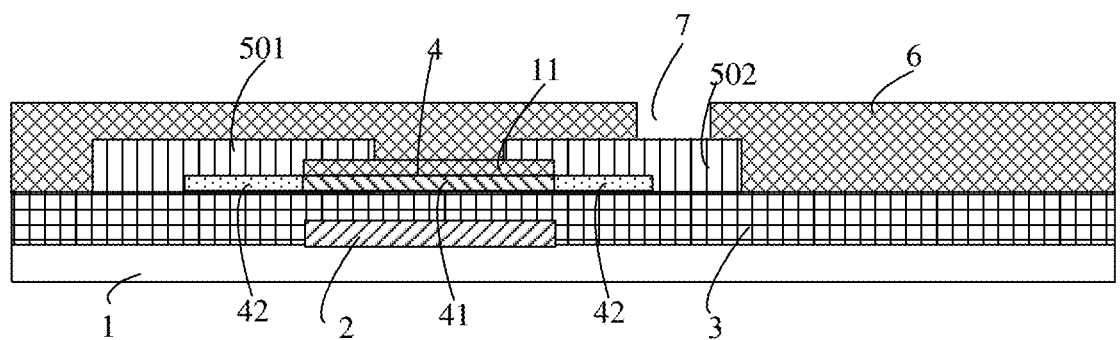

As illustrated in FIG. 4e, the via hole 7 is formed in the insulating layer 6. The via hole 7 exposes the drain electrode 502. For example, the via hole 7 is formed by a photolithography process.

Figure 4F:
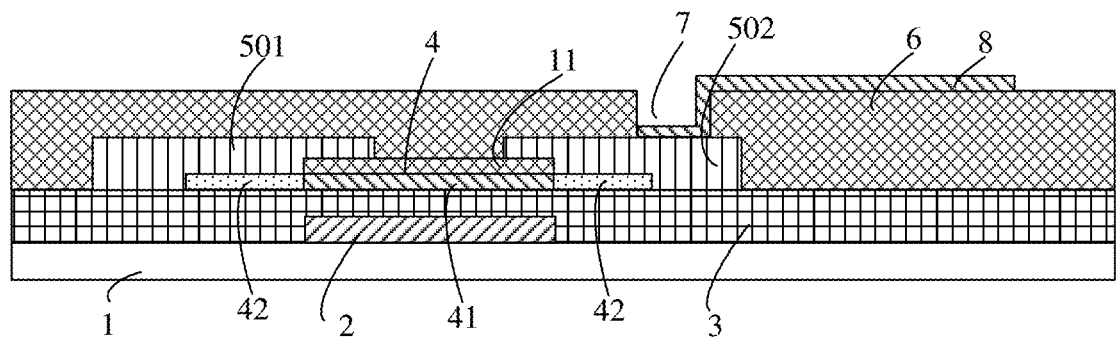

As illustrated in FIG. 4f, the pixel electrode film is formed on the via hole 7 and the insulating layer 6, and the pixel electrode film is patterned to form the pixel electrode layer 8. For example, the pixel electrode film is formed by the magnetron sputtering method or the chemical vapor deposition method, for example, the photolithography process is used to pattern the pixel electrode film.

FIG. 5a to FIG. 5h are schematic diagrams of still another manufacturing method of the bottom-gate type thin film transistor provided by at least one embodiment of the present disclosure, the method is suitable for manufacturing an etching stop layer (ESL) type thin film transistor. For example, the manufacturing method of the thin film transistor further includes forming an etching stop layer on the active layer before forming the source electrode and the drain electrode.

As illustrated in FIG. 5a, the manufacturing method comprises: providing the base substrate 1, forming the gate electrode thin film on the base substrate 1, and performing a patterning process on the gate electrode thin film to form the gate electrode 2. For example, the gate electrode thin film is formed by a magnetron sputtering method or a chemical vapor deposition method. For example, the base substrate 1 is the glass substrate, the plastic substrate or the quartz substrate.

As illustrated in FIG. 5b, the gate insulating film is deposited on the gate electrode 2, and a patterning process is performed on the gate insulating film to form the gate insulating layer 3. The active film is formed on the gate insulating layer 3, and a patterning process is performed on the active film to form the active layer 4. For example, the active film is formed by a chemical vapor deposition method. The active layer 4 comprises the channel region 41 overlapped with the gate electrode 2 and the second portion 42 on both sides of the channel region 41. The second portion 42 of the active layer 4 is not overlapped with the gate electrode 2, that is, in the direction parallel to the base substrate 1, the area of the active layer 4 is larger than the area of the gate electrode 2.

As illustrated in FIG. 5c, an etching stop film is deposited on the active layer 4, and the etching stop film is patterned to form the etching stop layer 9. For example, the etching stop layer 9 is a metal layer, such as titanium or other metal that is able to be transformed into a non-conducting medium film after being oxidized by oxygen plasma. For example, the method further comprises: oxidizing the etching stop layer 9 by oxygen plasma.

As illustrated in FIG. 5d, the source-drain electrode film is deposited on the active layer 4, and the source-drain electrode film is patterned to form the source electrode 501 and the drain electrode 502. The second portion 42 of the active layer 4 is electrically connected with the source electrode 501 and the drain electrode 502.

As illustrated in FIG. 5e, the insulating film is deposited on the source electrode 501 and the drain electrode 502, and the insulating film is patterned to form the insulating layer 6. The material of insulating layer 6 includes silicon oxide, nitride of silicon, nitrogen oxide of silicon, etc. Of course, the material of insulating layer 6 is not limited to the kinds mentioned-above.

As illustrated in FIG. 5f, after the insulating layer 6 is formed, the laser annealing process is performed on the side of the base substrate 1 without being disposed with the active layer 4 by using the gate electrode 2 as the mask. The channel region 41 of the active layer 4 is shielded by the gate electrode 2, in this way, the channel region 41 is not irradiated by the laser, the resistivity of the channel region 41 varies little, which does not affect its property as the semiconductor with the high mobility; and the resistivity of the second portion 42 which is not shielded by the gate electrode 2 decreases sharply under the high energy laser irradiation and the second portion 42 tends to be conductive, so that the resistivity of the second portion 42 of the active layer 4 is lower than the resistivity of the channel region 41. In this way, the contact resistance between the active layer 4 and the source electrode 501 and between the active layer 4 and the drain electrode 502 is reduced significantly, thereby the resistance of the thin film transistor in a case of being turned on is reduced, and the technical effects of increasing the on state current, increasing the mobility and increasing the switching ratio of the thin film transistors are achieved, which improves the transmission velocity of the signal transmitted by the thin film transistor.

Figure 5G:
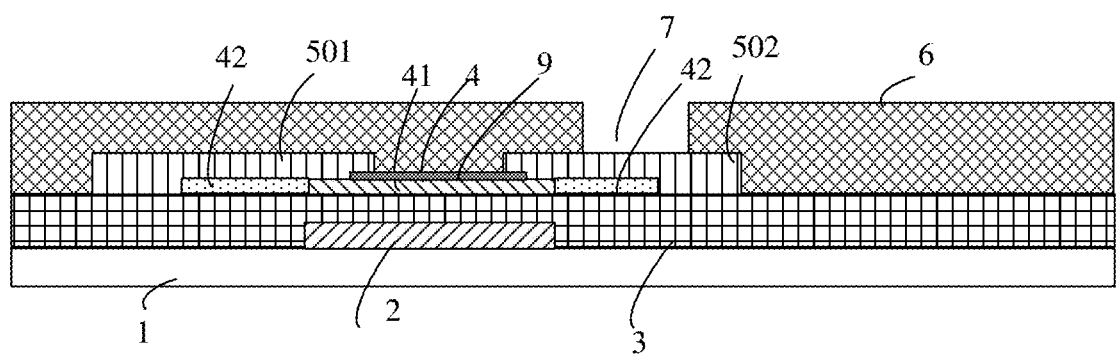

As illustrated in FIG. 5g, the via hole 7 is formed in the insulating layer 6. The via hole 7 exposes the drain electrode 502. For example, the via hole 7 is formed by a photolithography process.

Figure 5H:
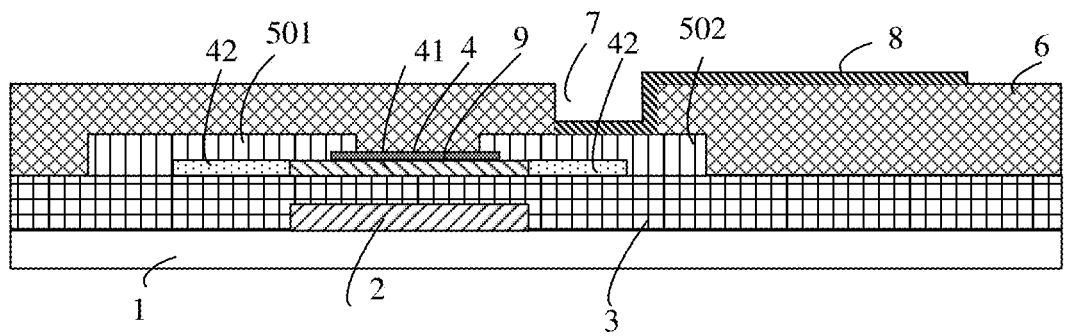

As illustrated in FIG. 5h, the pixel electrode film is formed on the via hole 7 and the insulating layer 6, and the pixel electrode film is patterned to form the pixel electrode layer 8. For example, the pixel electrode film is formed by the magnetron sputtering method or the chemical vapor deposition method, for example, the photolithography process is used to pattern the pixel electrode film.

The other process conditions of the example shown in FIG. 5a to FIG. 5h, such as the laser energy, are the same as those described in the example shown in FIG. 1a to FIG. 1g.

Figure 6:
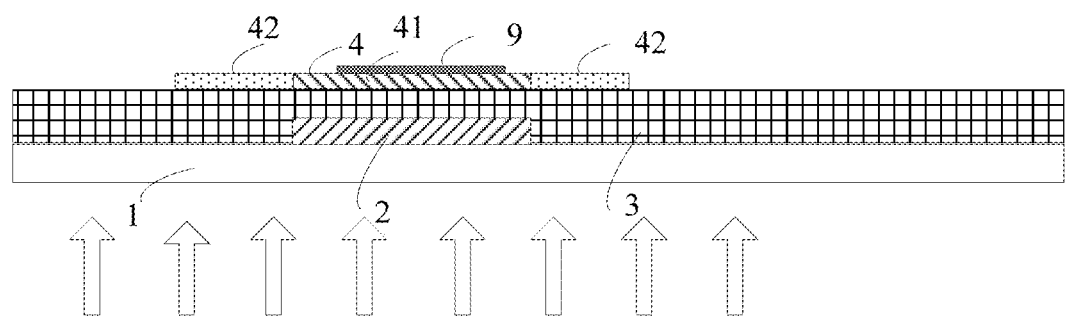
FIG. 6 is still another schematic diagram of the manufacturing method of the bottom-gate type thin film transistor provided by at least one embodiment of the present disclosure.

In another example of the present embodiment, as illustrated in FIG. 6, after the active layer 4 and the etching stop layer 9 are formed and before the source electrode 501 and the drain electrode 502 are formed, the laser annealing process is performed on the side of the base substrate 1 without being disposed with the active layer 4 by using the gate electrode 2 as the mask. The other steps of the method shown in FIG. 6 are the same as those shown in FIG. 1a to FIG. 1g, and the method shown in FIG. 6 achieves similar technical effects as those shown in FIG. 1a to FIG. 1g.

Figure 7:
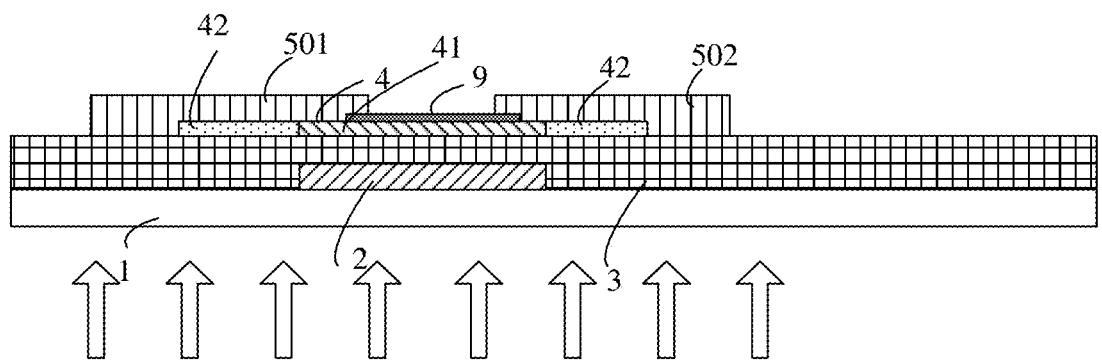
FIG. 7 is still another schematic diagram of the manufacturing method of the bottom-gate type thin film transistor provided by at least one embodiment of the present disclosure.

In another example of the present embodiment, as illustrated in FIG. 7, after the etching stop layer 9, the source electrode 501 and the drain electrode 502 are formed, the laser annealing process is performed on the side of the base substrate without being disposed with the active layer 4 by using the gate electrode 2 as the mask, for example, the laser annealing process is performed before the insulating layer 6 is formed. The other steps of the method shown in FIG. 7 are the same as those shown in FIG. 1a to FIG. 1g, and the method shown in FIG. 7 achieves similar technical effects as those shown in FIG. 1a to FIG. 1g.

FIG. 8a to FIG. 8j are schematic diagrams of a manufacturing method of a top-gate type thin film transistor provided by at least one embodiment of the present disclosure.

Figure 8A:
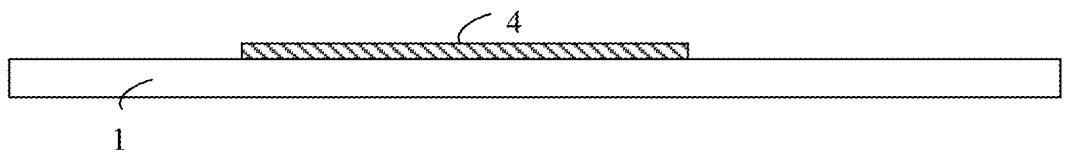
FIG. 8a to FIG. 8j are schematic diagrams of a manufacturing method of a top-gate type thin film transistor provided by at least one embodiment of the present disclosure.

As illustrated in FIG. 8a, the manufacturing method comprises: providing the base substrate 1. The active film is formed on the base substrate 1, and a patterning process is performed on the active film to form the active layer 4. For example, the active film is formed by a chemical vapor deposition method. The active layer 4 comprises the channel region 41 overlapped with the gate electrode 2 and the second portion 42 on both sides of the channel region 41.

Figure 8B:
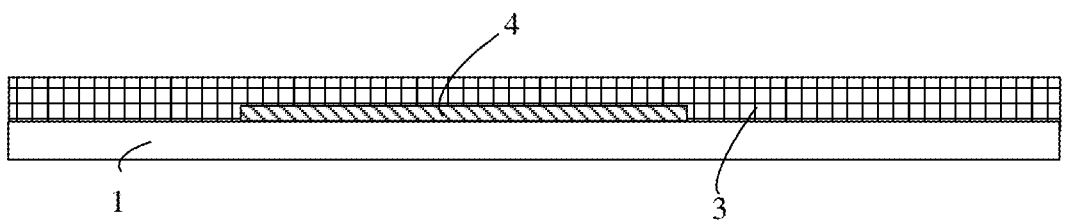

As illustrated in FIG. 8b, the gate insulating layer 3 is formed on the active layer 4. For example, the gate insulating layer 3 is formed by a coating method or a depositing method.

Figure 8C:
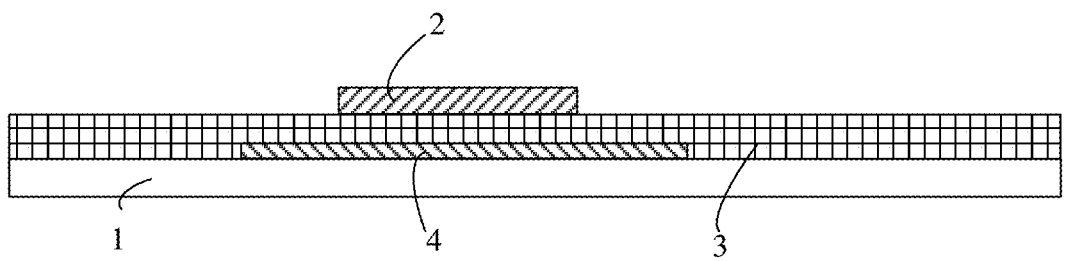

As illustrated in FIG. 8c, forming the gate electrode thin film on the gate insulating layer 3, and performing a patterning process on the gate electrode thin film to form the gate electrode 2. For example, the gate electrode thin film layer is formed by a magnetron sputtering method or a chemical vapor deposition method. The active layer 4 comprises the channel region 41 overlapped with the gate electrode 2 and the second portion 42 on both sides of the channel region 41.

Figure 8D:
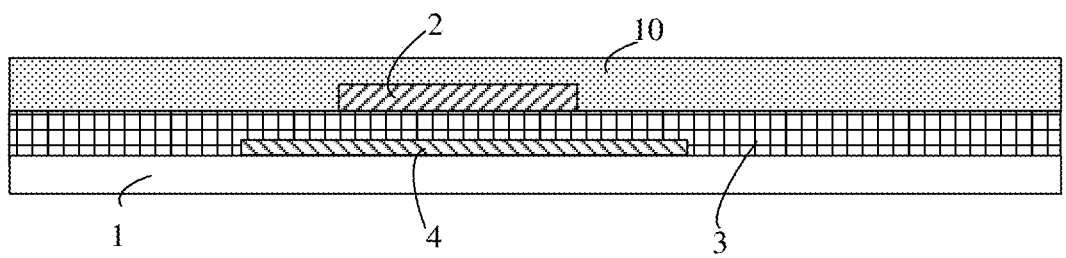

As illustrated in FIG. 8d, a second insulating layer 10 covering the gate electrode 2 is formed. The method for manufacturing the second insulating layer 10 and the material of the second insulating layer 10 are the same as those of the gate insulating layer 3, which are not repeated herein.

Figure 8E:
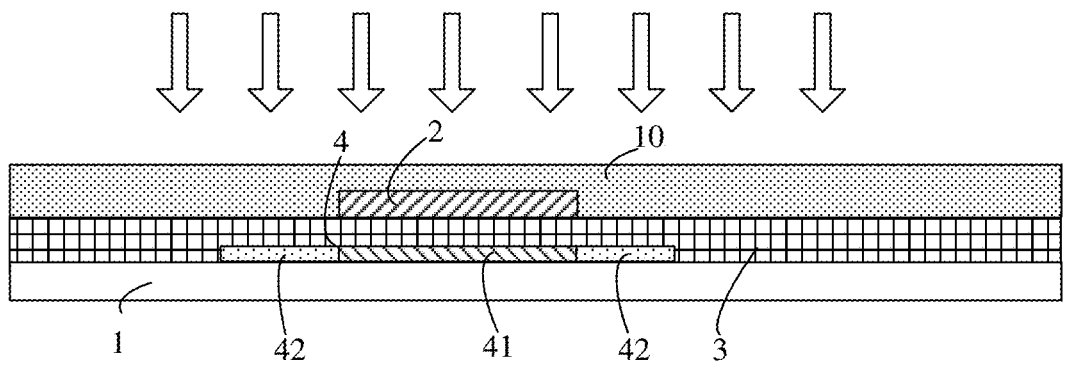

As illustrated in FIG. 8e, after the second insulating layer 10 is formed, the laser annealing process is performed on a side of the base substrate disposed with the active layer 4 by using the gate electrode 2 as the mask. The channel region 41 of the active layer 4 is shielded by the gate electrode 2, in this way, the channel region 41 is not irradiated by the laser, the resistivity of the channel region 41 varies little, which does not affect its property as the semiconductor with the high mobility; and the resistivity of the second portion 42 which is not shielded by the gate electrode 2 decreases sharply under the high energy laser irradiation and the second portion 42 tends to be conductive, so that the resistivity of the second portion 42 of the active layer 4 is lower than the resistivity of the channel region 41. In this way, the contact resistance between the active layer 4 and the source electrode 501 and between the active layer 4 and the drain electrode 502 is reduced significantly, thereby the resistance of the thin film transistor in a case of being turned on is reduced, which improves a transmission velocity of the signal transmitted by the thin film transistor.

Figure 8F:
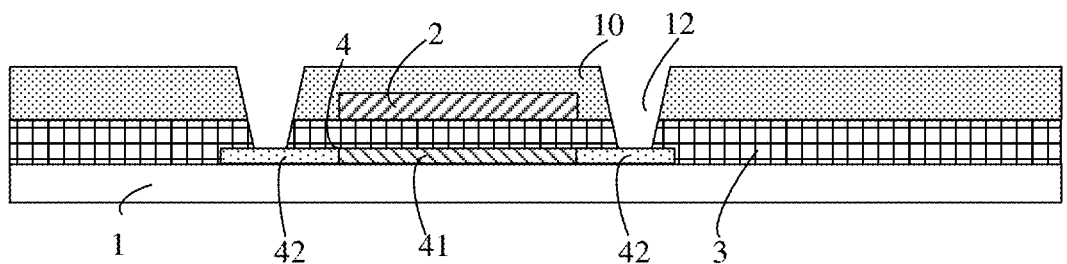

As illustrated in FIG. 8f, a via hole 12 is formed in the gate insulating layer 3 and the second insulating layer 10.

Figure 8G:
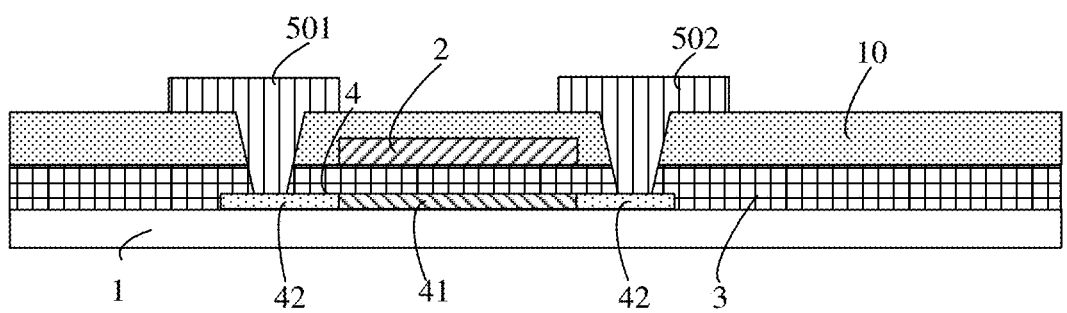

As illustrated in FIG. 8g, the source-drain electrode film is deposited on the second insulating layer 10, and the source-drain electrode film is patterned to form the source electrode 501 and the drain electrode 502. The second portion 42 of the active layer 4 is electrically connected with the source electrode 501 and the drain electrode 502.

Figure 8H:
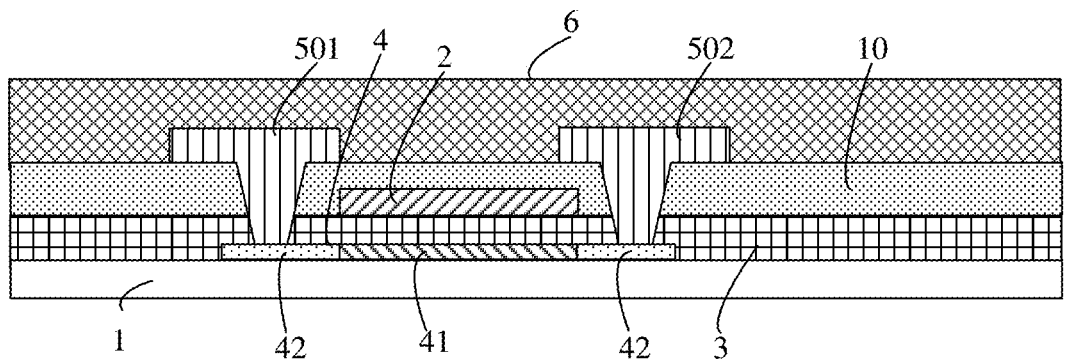

As illustrated in FIG. 8h, the insulating layer 6 is formed on the source electrode 501 and the drain electrode 502. The method for manufacturing the insulating layer 6 and the material of the insulating layer 6 refer to the above descriptions.

Figure 8I:
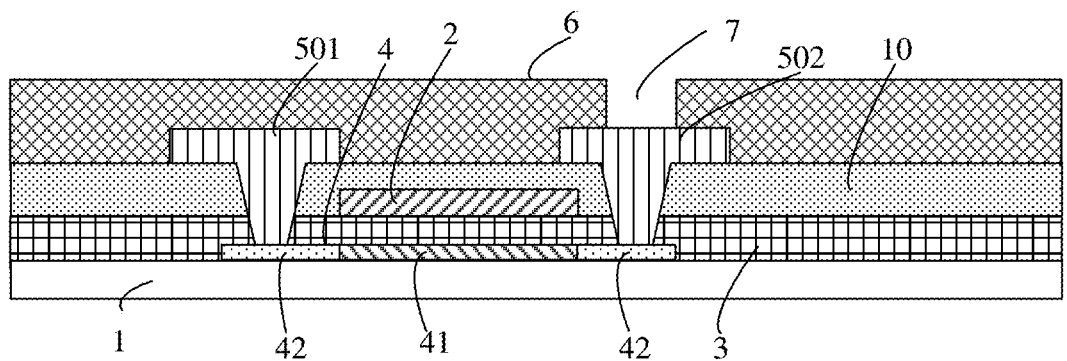

As illustrated in FIG. 8i, the via hole 7 is formed in the insulating layer 6. The via hole 7 exposes the drain electrode 502. For example, the via hole 7 is formed by a photolithography process.

Figure 8J:
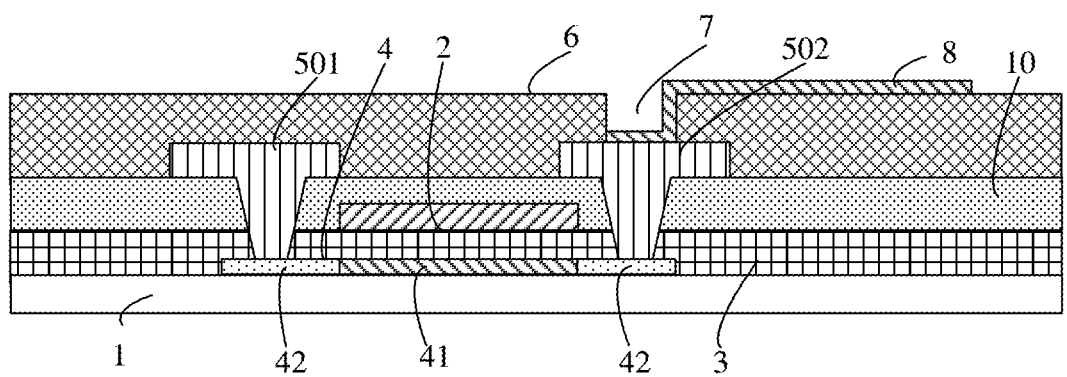

As illustrated in FIG. 8j, the pixel electrode film is formed on the via hole 7 and the insulating layer 6, and the pixel electrode film is patterned to form the pixel electrode layer 8. For example, the pixel electrode film is formed by the magnetron sputtering method or the chemical vapor deposition method, for example, the photolithography process is used to pattern the pixel electrode film.

The other process conditions of the example shown in FIG. 8a to FIG. 8j, such as the laser energy, are the same as those described in the example shown in FIG. 1a to FIG. 1g.

Figure 9:
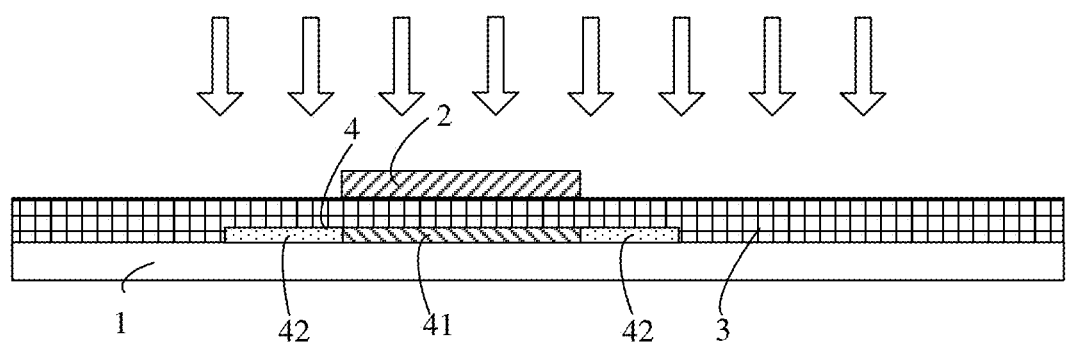
FIG. 9 is another schematic diagram of the manufacturing method of the top-gate type thin film transistor provided by at least one embodiment of the present disclosure.

In another example of the present embodiment, as illustrated in FIG. 9, before the second insulating layer 10 is formed, the laser annealing process is performed on the side of the base substrate disposed with the active layer 4 by using the gate electrode 2 the mask. The other steps of the method shown in FIG. 9 are the same as those shown in FIG. 8a to FIG. 8g, and the method shown in FIG. 9 achieves similar technical effects as those shown in FIG. 8a to FIG. 8g.

FIG. 10a to FIG. 10k are schematic diagrams of another manufacturing method of the top-gate type thin film transistor provided by at least one embodiment of the present disclosure. The manufacturing method of the thin film transistor further comprises: forming a shielding layer that overlaps with at least a portion of the channel region on a side of the active layer facing the base substrate, and performing the laser annealing process on the side of the base substrate without the active layer by using the shielding layer as a mask.

Figure 10A:
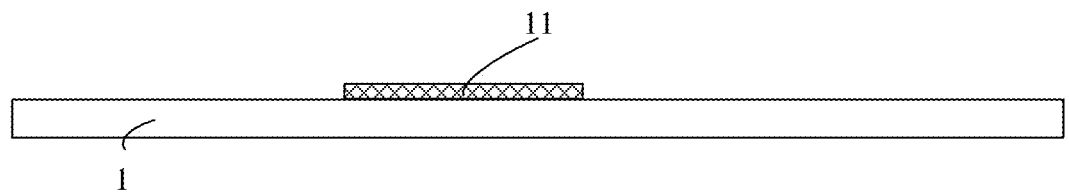
FIG. 10a to FIG. 10k are still another schematic diagrams of the manufacturing method of the top-gate type thin film transistor provided by at least one embodiment of the present disclosure.

As illustrated in FIG. 10a, the manufacturing method comprises: providing the base substrate 1; forming a shielding film on the base substrate 1, and patterning the shielding film to form the shielding layer 11 which is opaque.

Figure 10B:
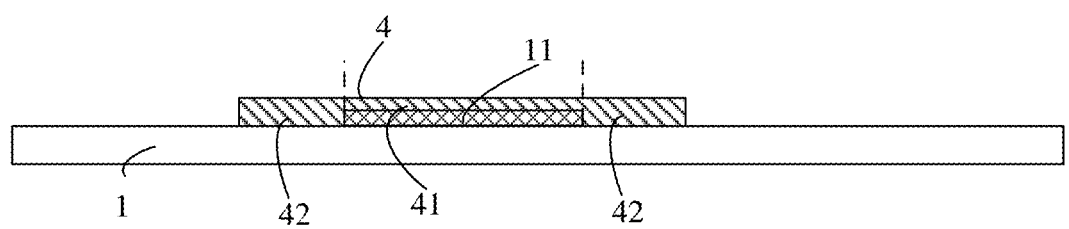

As illustrated in FIG. 10b, the active film is formed on the shielding layer 11, and a patterning process is performed on the active film to form the active layer 4. For example, the active film is formed by a chemical vapor deposition method. The active layer 4 comprises the channel region 41 overlapped with the shielding layer 11 and the second portion 42 on both sides of the channel region 41.

Figure 10C:
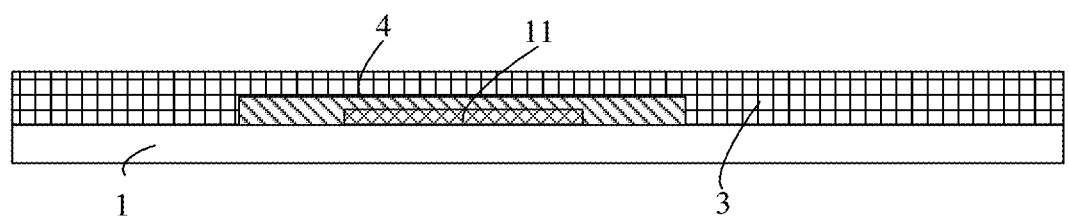

As illustrated in FIG. 10c, the gate insulating layer 3 is formed on the active layer 4. For example, the gate insulating layer 3 is formed by a coating method or a depositing method.

Figure 10D:
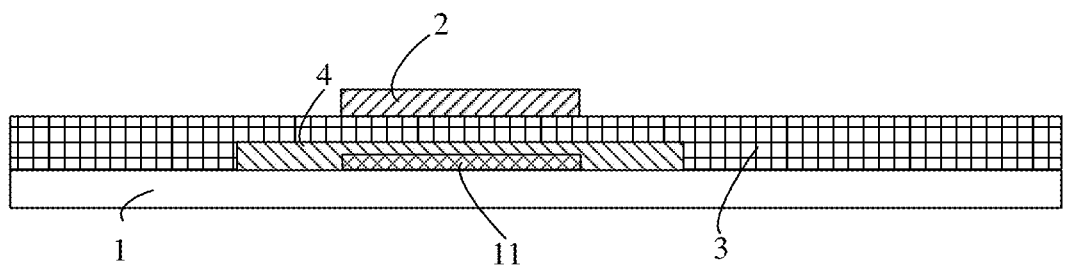

As illustrated in FIG. 10d, the gate electrode thin film is formed on the gate insulating layer 3, and a patterning process is performed on the gate electrode thin film to form the gate electrode 2. For example, the gate electrode thin film is formed by a magnetron sputtering method or a chemical vapor deposition method. The gate electrode 2 is overlapped with a portion of the active layer 4.

Figure 10E:
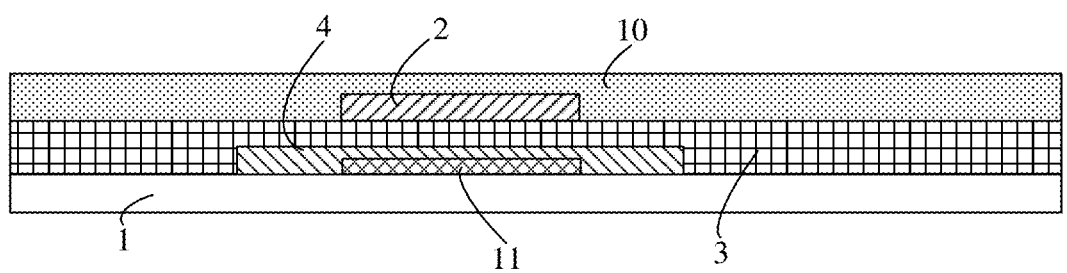

As illustrated in FIG. 10e, the second insulating layer 10 covering the gate electrode 2 is formed. The method for manufacturing the second insulating layer 10 and the material of the second insulating layer 10 are the same as those of the gate insulating layer 3, which are not repeated here.

Figure 10F:
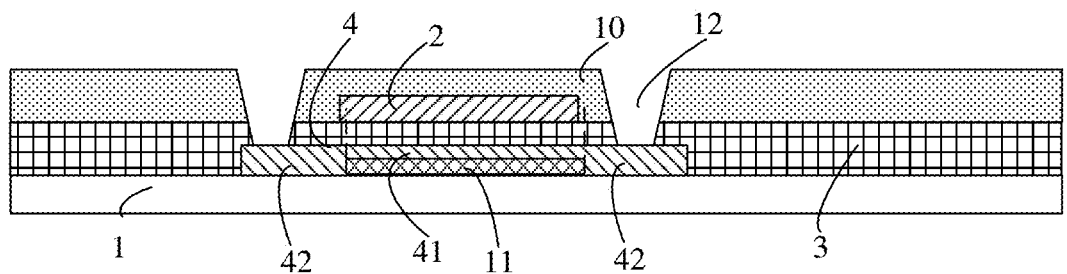

As illustrated in FIG. 10f, after the second insulating layer 10 is formed, the via hole 12 is formed in the gate insulating layer 3 and the second insulating layer 10.

Figure 10G:
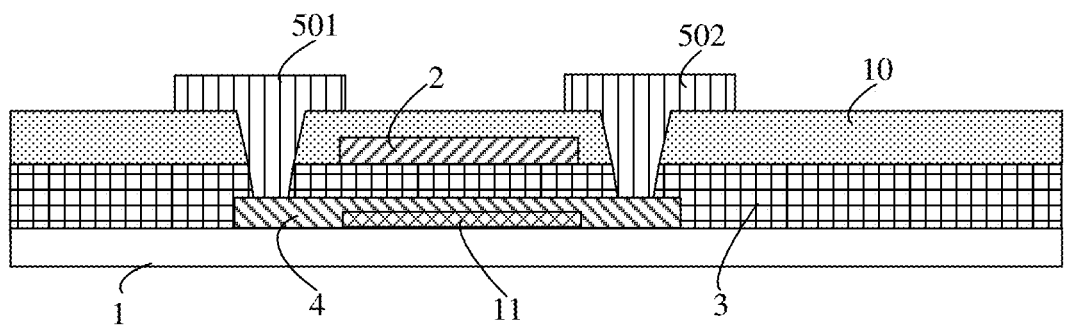

As illustrated in FIG. 10g, the source-drain electrode film is deposited on the second insulating layer 10, and the source-drain electrode film is patterned to form the source electrode 501 and the drain electrode 502. The second portion 42 of the active layer 4 is electrically connected with the source electrode 501 and the drain electrode 502.

Figure 10H:
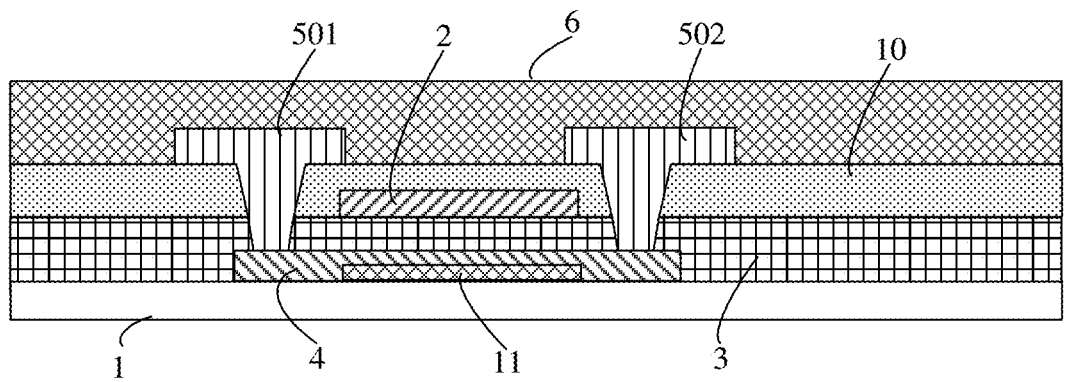

As illustrated in FIG. 10h, the insulating layer 6 is formed on the source electrode 501 and the drain electrode 502. The method for manufacturing the insulating layer 6 and the material of the insulating layer 6 refer to the above descriptions.

Figure 10I:
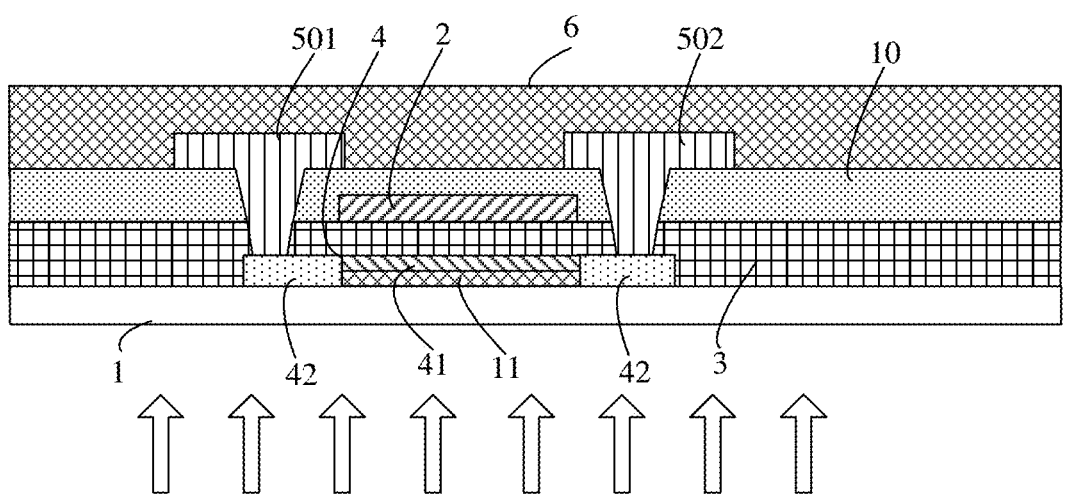
Figure 10J:
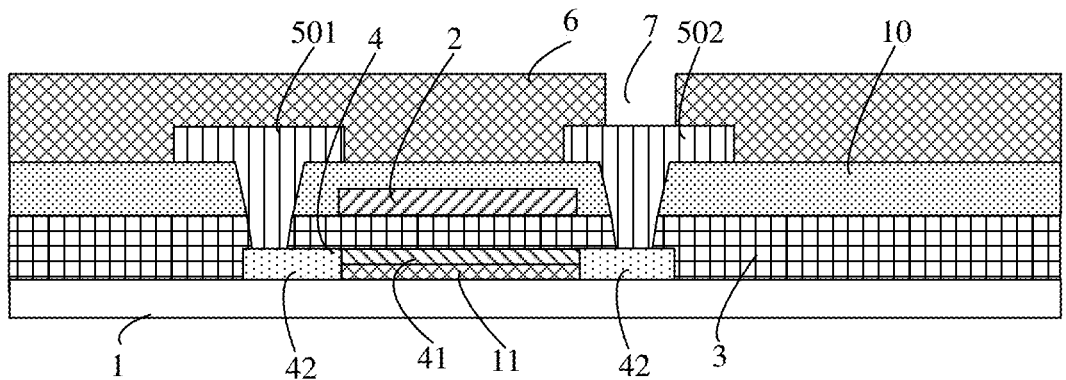

As illustrated in FIG. 10i, the laser annealing process is performed on the side of the base substrate without being disposed with the active layer 4 by using the shielding layer 11 as the mask. The channel region 41 of the active layer 4 is shielded by the shielding layer 11, in this way, the channel region 41 is not irradiated by the laser, the resistivity of the channel region 41 varies little, which does not affect its property as the semiconductor with the high mobility; and the resistivity of the second portion 42 which is not shielded by the shielding layer 11 decreases sharply under the high energy laser irradiation and the second portion 42 tends to be conductive, so that the resistivity of the second portion 42 of the active layer 4 is lower than the resistivity of the channel region 41. In this way, the contact resistance between the active layer 4 and the source electrode 501 and between the active layer 4 and the drain electrode 502 is reduced significantly, thereby the resistance of the thin film transistor in a case of being turned on is reduced, and the technical effects of increasing the on state current, increasing the mobility and increasing the switching ratio of the thin film transistors are achieved, which improves the transmission velocity of the signal transmitted by the thin film transistor.

As illustrated in FIG. 10i, the via hole 7 is formed in the insulating layer 6. The via hole 7 exposes the drain electrode 502. For example, the via hole 7 is formed by a photolithography process.

Figure 10K:
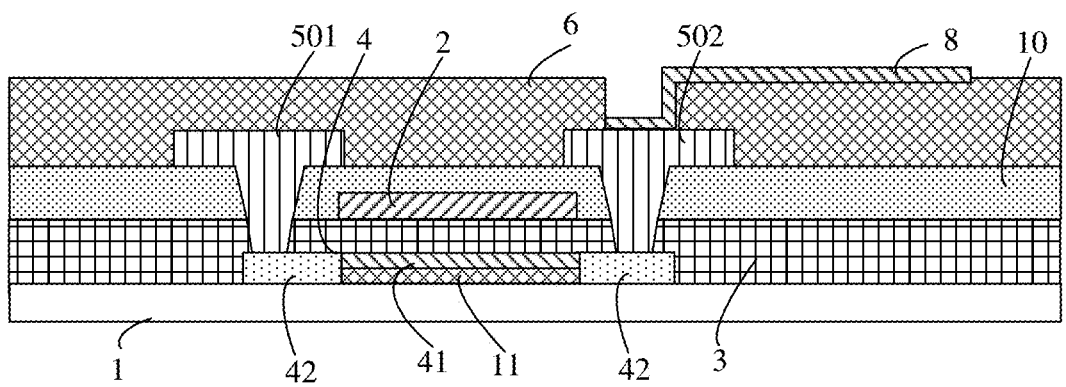

As illustrated in FIG. 10k, the pixel electrode film is formed on the via hole 7 and the insulating layer 6, and the pixel electrode film is patterned to form the pixel electrode layer 8. For example, the pixel electrode film is formed by the magnetron sputtering method or the chemical vapor deposition method, for example, the photolithography process is used to pattern the pixel electrode film.

The other process conditions of the example shown in FIG. 10a to FIG. 10k, such as the laser energy, are the same as those described in the example shown in FIG. 1a to FIG. 1g.

Figure 11:
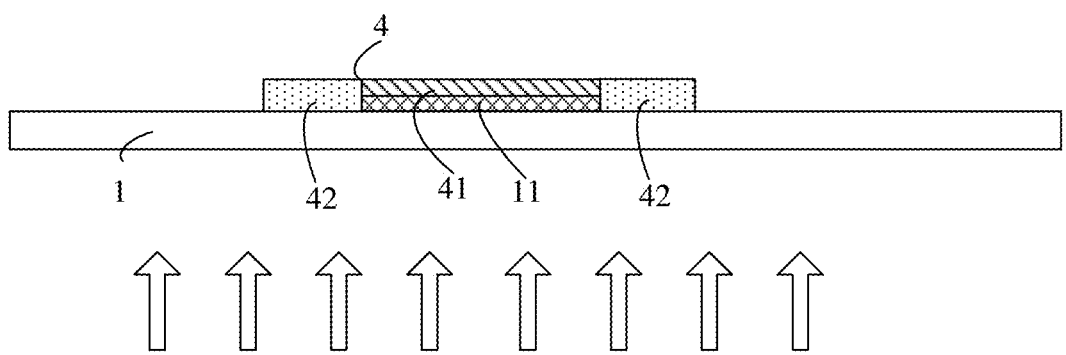
FIG. 11 is another schematic diagram of the manufacturing method of the top-gate type thin film transistor provided by at least one embodiment of the present disclosure.
Figure 12:
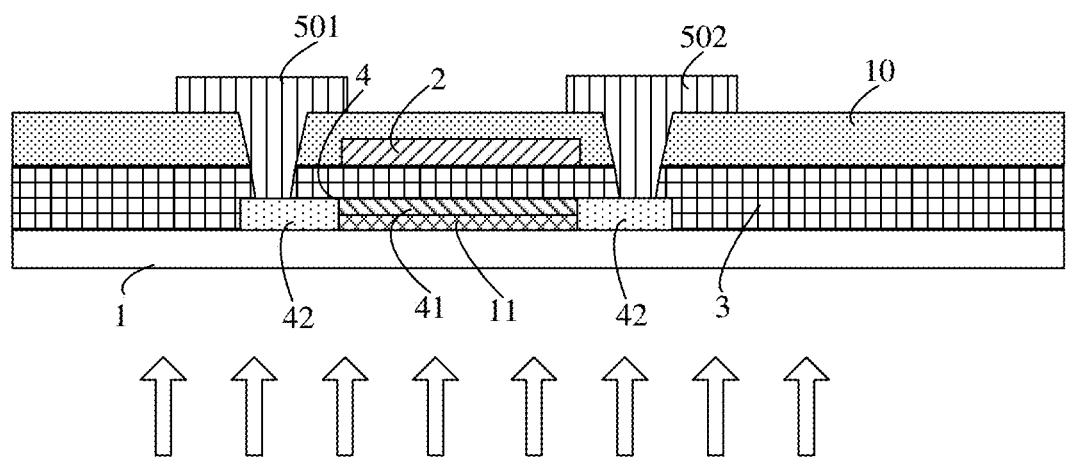
FIG. 12 is still another schematic diagram of the manufacturing method of the top-gate type thin film transistor provided by at least one embodiment of the present disclosure.

In another example of the present embodiment, as illustrated in FIG. 11, the laser annealing process is performed on the side of the base substrate without being disposed with the active layer 4 by using the shielding layer 11 as the mask before the source electrode and the drain electrode are formed. The other steps of the method shown in FIG. 12 are the same as those shown in FIG. 8a to FIG. 8g, and the method shown in FIG. 12 achieves similar technical effects as those shown in FIG. 8a to FIG. 8g. In another example of the present embodiment, as illustrated in FIG. 12, the laser annealing process is performed on the side of the base substrate without being disposed with the active layer 4 by using the shielding layer 11 as the mask after the source electrode and the drain electrode are formed and before the insulating layer 6 is formed. The other steps of the method shown in FIG. 12 are the same as those shown in FIG. 8a to FIG. 8g, and the method shown in FIG. 12 achieves similar technical effects as those shown in FIG. 8a to FIG. 8g.

For example, in another manufacturing method of the top-gate type thin film transistor provided by at least one embodiment of the present disclosure, the manufacturing method of the thin film transistor further includes before forming the gate electrode, an etching stop layer is formed on the active layer. The other steps are the same as the previous method of manufacturing the top-gate type thin film transistor.

For example, the laser annealing process in the embodiments of the present disclosure is an excimer laser annealing process or a continuous oscillation laser annealing process, but it is not limited to the two laser annealing processes.

It should be noted that, in the manufacturing method of the thin film transistors provided by the embodiments of the present disclosure, each of the steps is not limited to the order in the above embodiments.

At least one embodiment of the present disclosure provides a thin film transistor, which comprises: a gate electrode, an active layer, a source electrode and a drain electrode disposed on a base substrate. The active layer comprises a channel region and a second portion, at least a portion of the channel region is overlapped with the gate electrode and the second portion is not overlapped with the gate electrode; due to a laser annealing process, a resistivity of the second portion of the active layer is lower than a resistivity of the channel region of the active layer, and the second portion of the active layer is connected with the source electrode and the drain electrode.

Figure 13:
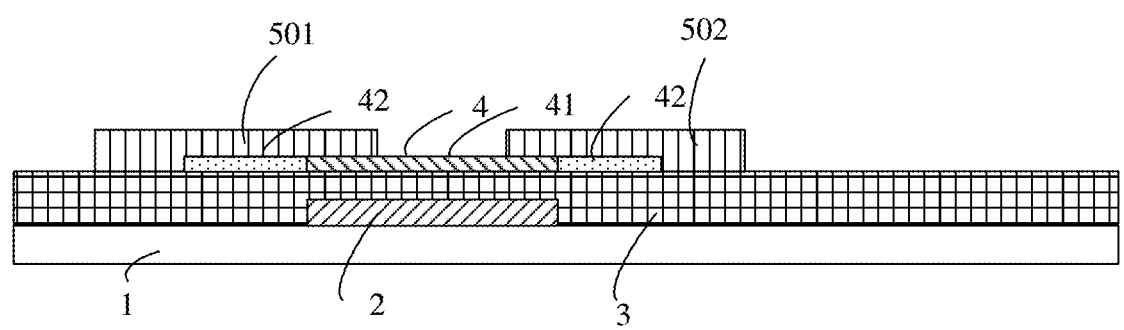
FIG. 13 is a schematic diagram of a bottom-gate type thin film transistor provided by at least one embodiment of the present disclosure.

For example, the thin film transistor in the embodiments of the present disclosure is a bottom-gate type thin film transistor. Exemplarily, FIG. 13 is a schematic diagram of the bottom-gate type thin film transistor provided by at least one embodiment of the present disclosure. As illustrated in FIG. 13, the thin film transistor comprises: a gate electrode 2, a gate insulating layer 3, an active layer 4, a source electrode 501 and a drain electrode 502 disposed on a base substrate 1. The active layer 4 comprises a channel region 41 overlapped with the gate electrode 2 and a second portion 42 not overlapped with the gate electrode 2, and a laser annealing process is performed on a side of the base substrate 1 without the active layer 4 by using the gate electrode 2 as a mask to form the second portion, in this way, a resistivity of the second portion 42 is lower than a resistivity of the channel region 41, and the second portion 42 of the active layer 4 is connected with the source electrode 501 and the drain electrode 502. In the thin film transistor, the resistivity of the second portion 42 of the active layer 4 is lower than the resistivity of the channel region 41 of the active layer 4. In this way, a contact resistance between the active layer 4 and the source electrode 501 and between the active layer 4 and the drain electrode 502 is reduced significantly, thereby a resistance of the thin film transistor in a case of being turned on is reduced, and the technical effects of increasing an on state current, increasing a mobility and increasing a switching ratio of the thin film transistors are achieved, which improves a transmission velocity of the signal transmitted by the thin film transistor.

In at least one embodiment of the present disclosure, for example, the material of the gate electrode 2 is a metal, such as a copper based metal. For example, the copper based metal is copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium alloy (Cu/Mo/Nb) and so on. For example, the material of the gate electrode is a chromium based metal, such as chromium molybdenum alloy (Cr/Mo), chrome titanium alloy (Cr/Ti), chrome molybdenum titanium alloy (Cr/Mo/Ti), etc. However, the material of the gate electrode 2 is not limited to the kinds listed above.

In at least one embodiment, for example, the thin film transistor is an oxide thin film transistor, and the active layer is made of an oxide semiconductor material. For example, the oxide semiconductor material is indium gallium zinc oxide (IGZO), indium zinc oxide (IZO), Zinc Oxide (ZnO), gallium oxide zinc (GZO) or other metal oxides. However, the material of the active layer is not limited to the kinds mentioned-above.

Other details of the thin film transistor refer to the method embodiments as described above, which is omitted here.

Figure 14:
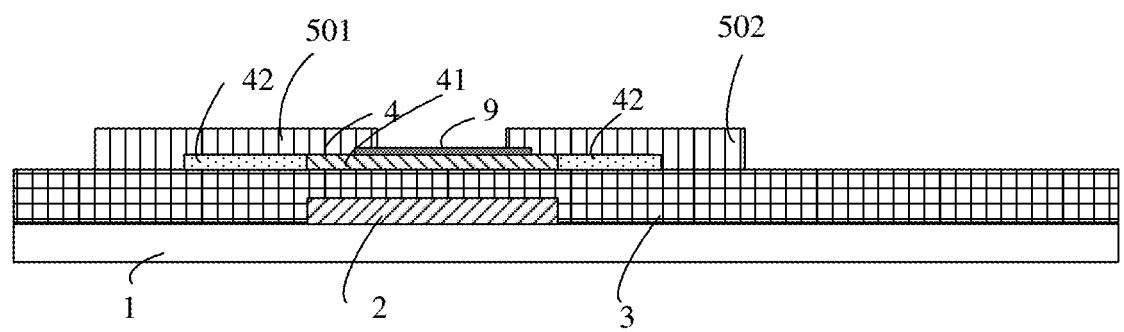
FIG. 14 is another schematic diagram of the bottom-gate type thin film transistor provided by at least one embodiment of the present disclosure.

FIG. 14 is another schematic diagram of the bottom-gate type thin film transistor provided by at least one embodiment of the present disclosure. The difference between the thin film transistor shown in FIG. 14 and that shown in FIG. 13 is that, the thin film transistor shown in FIG. 14 further includes an etching stop layer 9 arranged on the active layer 4, which prevents the active layer 4 from being excessive etched, and prevents other impurities from entering the active layer 4 and affecting the performance of the thin film transistor.

Figure 15:
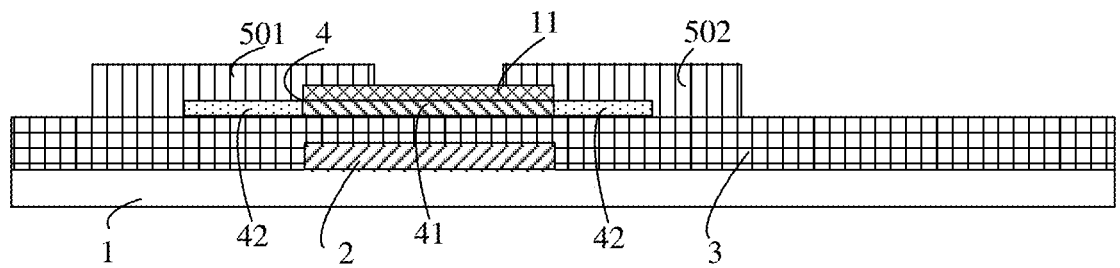
FIG. 15 is still another schematic diagram of the bottom-gate type thin film transistor provided by at least one embodiment of the present disclosure.

FIG. 15 is still another schematic diagram of the bottom-gate type thin film transistor provided by at least one embodiment of the present disclosure. The difference between the thin film transistor shown in FIG. 15 and that shown in FIG. 13 is that, the thin film transistor shown in FIG. 15 further includes a shielding layer 11, and the shielding layer 11 is disposed at a side of the active layer 4 facing away from the base substrate 1 and overlapped with the channel region 41. In a process of manufacturing the thin film transistor, the laser annealing process is performed on the side of the base substrate provided with the active layer by using the shielding layer 11 as a mask, the shielding layer 11 is used as the mask to shield the channel region 41, in this way, the channel region 41 of the active layer 4 is not irradiated by the laser, the resistivity of the channel region 41 varies little, which does not affect its property as a semiconductor with a high mobility; and the resistivity of the second portion 42 which is not shielded by the gate electrode 2 decreases sharply under a high energy laser irradiation and the second portion 42 tends to be conductive, so that the resistivity of the second portion 42 of the active layer 4 is lower than the resistivity of the channel region 41. In this way, the achieved technical effects refer to the above descriptions.

Figure 16:
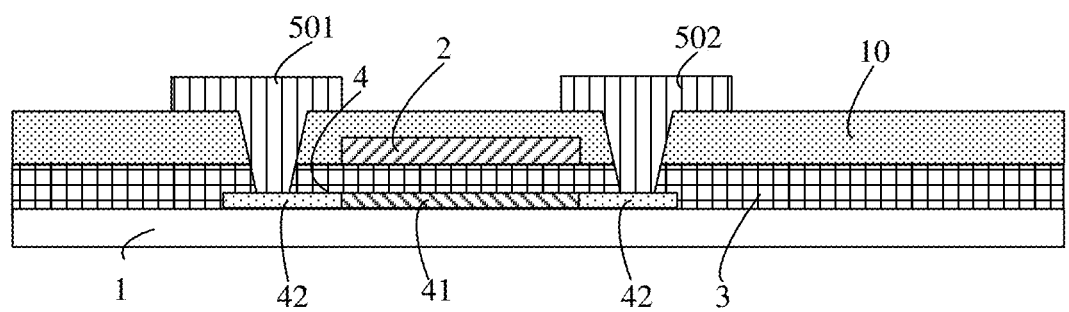
FIG. 16 is a schematic diagram of a top-gate type thin film transistor provided by at least one embodiment of the present disclosure.

For example, the thin film transistor in the embodiments of the present disclosure is a top-gate type thin film transistor. Exemplarily, FIG. 16 is a schematic diagram of the top-gate type thin film transistor provided by at least one embodiment of the present disclosure. As illustrated in FIG. 16, the difference between the thin film transistor shown in FIG. 16 and that shown in FIG. 13 is that, the gate electrode 2 is disposed on a side of the active layer facing away from the base substrate 1, the active layer 4 includes the channel region 41 that is overlapped with the gate electrode 2 and the second portion 42 that is not overlapped with the gate electrode 2, and the channel region 41 and the second portion 42 are formed by performing the laser annealing process on the side of the base substrate provided with the active layer by using the gate electrode 2 as the mask. The second portion 42 of the active layer is electrically connected with the source electrode 501 and the drain electrode 502 through a via hole. The other features and technical effects of the thin film transistor shown in FIG. 16 are the same as those of the thin film transistor shown in FIG. 13.

Figure 17:
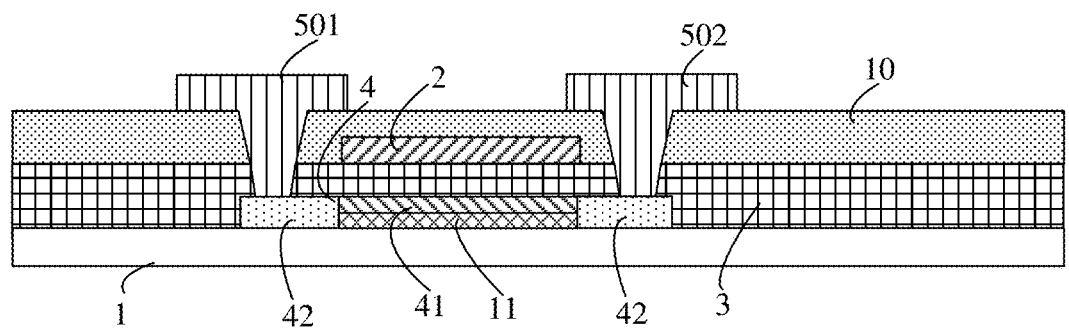
FIG. 17 is another schematic diagram of the top-gate type thin film transistor provided by at least one embodiment of the present disclosure.

For example, FIG. 17 is another schematic diagram of the top-gate type thin film transistor provided by at least one embodiment of the present disclosure. The difference between the thin film transistor shown in FIG. 17 and that shown in FIG. 16 is that, the thin film transistor shown in FIG. 17 further comprises a shielding layer 11 disposed on a side of the active layer facing the base substrate and overlapped with the channel region 41, the active layer 4 includes the channel region 41 that is overlapped with the gate electrode 2 and the second portion 42 that is not overlapped with the gate electrode 2, and the channel region 42 and the second portion 42 are formed by performing the laser annealing process on the side of the base substrate without being provided with the active layer by using the shielding layer 11 as a mask. The other features and technical effects of the thin film transistor shown in FIG. 17 are the same as those of the thin film transistor shown in FIG. 16.

Another embodiment of the disclosure provides an array substrate, which includes any one of the thin film transistors provided in the embodiments of the disclosure.

Figure 18:
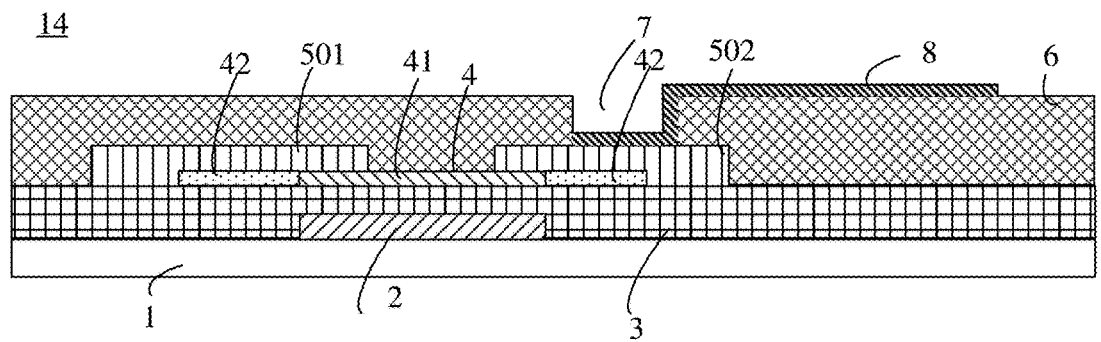
FIG. 18 is a schematic diagram of an array substrate provided by at least one embodiment of the present disclosure.

FIG. 18 is a schematic diagram of the array substrate provided by at least one embodiment of the present disclosure. As illustrated in FIG. 18, the array substrate 14 includes the thin film transistor as illustrated in FIG. 13, the array substrate 14 further includes an insulating layer 6 and a pixel electrode layer 8, and the pixel electrode layer 8 is electrically connected with the drain electrode 502 of the thin film transistor by a via hole 7 in the insulating layer 6. The array substrate 14 includes a plurality of array units, and the thin film transistor is used as a switching element of each of the array units. A contact resistance between the active layer 4 and the source electrode 501 and between the active layer 4 and the drain electrode 502 of the thin film transistor in the array substrate is reduced significantly, thereby a resistance of the thin film transistor in a case of being turned on is reduced, and the technical effects of increasing an on state current, increasing a mobility and increasing a switching ratio of the thin film transistors are achieved, which improves a transmission velocity of the signal transmitted by the thin film transistor, and helps to better control the working of the plurality of the array units of the array substrate.

For example, a material of the pixel electrode layer 8 is a transparent conductive material or a metal material. For example, the material of the pixel electrode layer 8 includes indium tin oxide (ITO), indium zinc oxide (IZO), indium gallium oxide (IGO), gallium zinc oxide (GZO), Zinc Oxide (ZnO), indium oxide ($In_2O_3$), alumina zinc (AZO), and carbon nanotubes, etc. The material of the pixel electrode layer is not limited to the kinds listed above.

For example, the array substrate 14 is applied to, for example, a liquid crystal display panel, an organic light emitting diode display panel, or an electronic paper display panel, etc.

Figure 19:
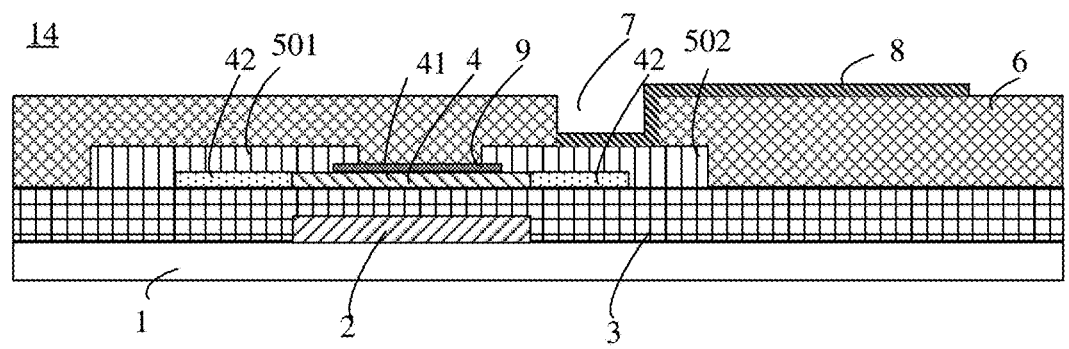
FIG. 19 is another schematic diagram of the array substrate provided by at least one embodiment of the present disclosure.

FIG. 19 is another schematic diagram of the array substrate provided by at least one embodiment of the present disclosure. The difference between the array substrate shown in FIG. 19 and that shown in FIG. 18 is that, it includes another thin film transistor, that is, the thin film transistor shown in FIG. 14. The other features and technical effects of the array substrate shown in FIG. 19 are the same as those of the array substrate shown in FIG. 18.

Figure 20:
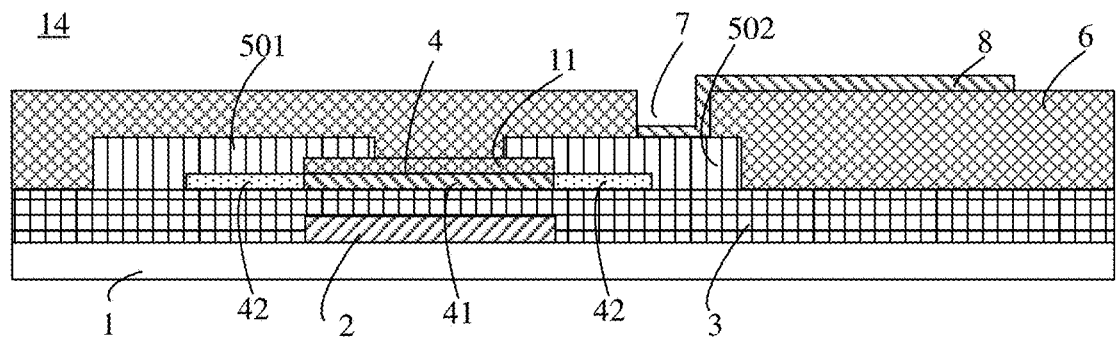
FIG. 20 is still another schematic diagram of the array substrate provided by at least one embodiment of the present disclosure.

FIG. 20 is a schematic diagram of the array substrate provided by at least one embodiment of the present disclosure. The difference between the array substrate shown in FIG. 20 and that shown in FIG. 18 is that, it includes another thin film transistor, that is, the thin film transistor shown in FIG. 15. The other features and technical effects of the array substrate shown in FIG. 20 are the same as those of the array substrate shown in FIG. 18.

Figure 21:
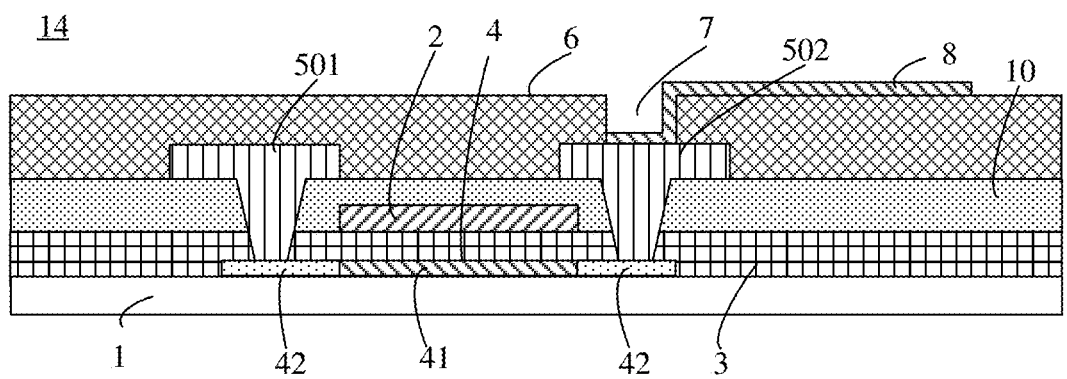
FIG. 21 is still another schematic diagram of the array substrate provided by at least one embodiment of the present disclosure.

FIG. 21 is a schematic diagram of the array substrate provided by at least one embodiment of the present disclosure. The difference between the array substrate shown in FIG. 21 and that shown in FIG. 18 is that, it includes another thin film transistor, that is, the thin film transistor shown in FIG. 16. The other features and technical effects of the array substrate shown in FIG. 21 are the same as those of the array substrate shown in FIG. 19.

Figure 22:
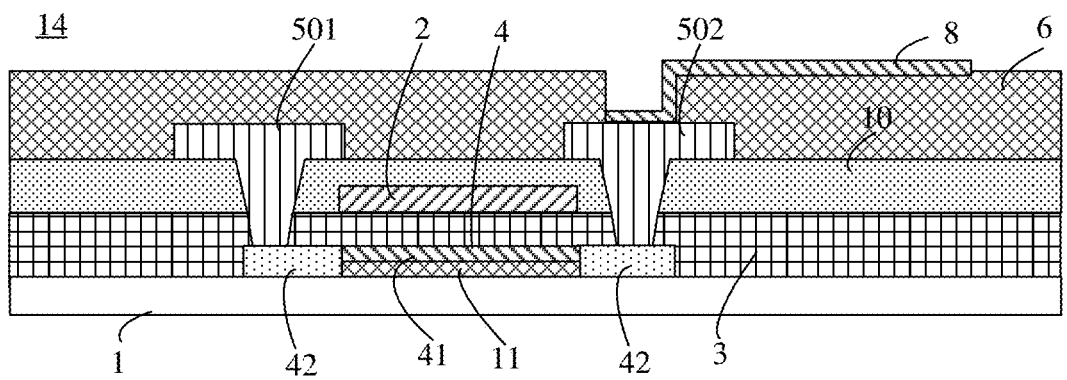
FIG. 22 is still another schematic diagram of the array substrate provided by at least one embodiment of the present disclosure.

FIG. 22 is a schematic diagram of the array substrate provided by at least one embodiment of the present disclosure. The difference between the array substrate shown in FIG. 22 and that shown in FIG. 18 is that, it includes another thin film transistor, that is, the thin film transistor shown in FIG. 17. The other features and technical effects of the array substrate shown in FIG. 22 are the same as those of the array substrate shown in FIG. 18.

Another embodiment of the present disclosure further provides a display device, which comprises any one of the above mentioned array substrates.

Figure 23:
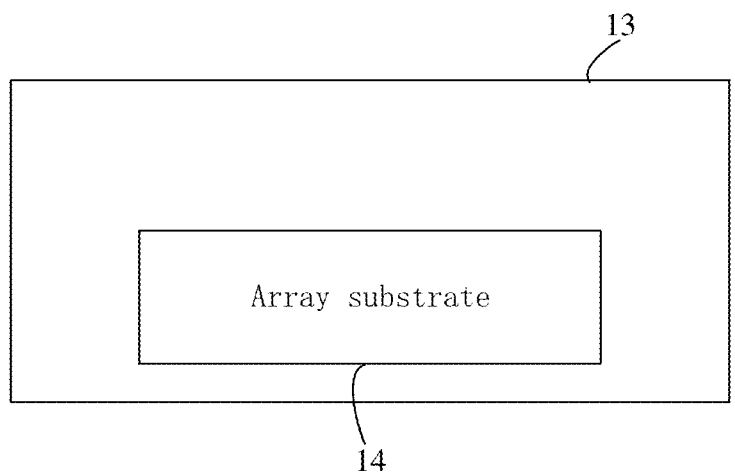
FIG. 23 is a schematic diagram of a display device provided by at least one embodiment of the present disclosure.

FIG. 23 is a schematic diagram of the display device provided by at least one embodiment of the present disclosure. For example, the display device 13 is a liquid crystal display device, which comprises an array substrate 14 and an opposite substrate. The array substrate and the opposite substrate are bonded to each other to form a liquid crystal cell, and the liquid crystal cell is filled with liquid crystal material. The opposite substrate, for example, is a color filter substrate. The pixel electrodes of each sub-pixels of the array substrate are used to control the rotation degree of the liquid crystal material by applying an electric field for displaying. In some examples, the display device further includes a backlight for providing back light for the array substrate.

For example, the display device 13 is an organic light emitting diode display device (OLED), a lamination of organic light-emitting materials is formed on the array substrate, and the pixel electrodes of each pixel units are used as anodes or cathodes to drive the organic light-emitting materials to emit light and to display.

For example, the display device 13 is an electronic paper display device, an electronic ink layer is formed on the array substrate, and the pixel electrodes of each pixel units are used for forming a voltage for driving the charged micro particles in the driving electronic ink to move for a display operation.

It should be noted that, the display device provided by the embodiments of the present disclosure is not limited to the liquid crystal display device, the organic light-emitting diode display device and the electronic paper display device listed above. In addition, FIG. 23 only illustrates the array substrate 14, and the other structures of the display device refer to the conventional technology in the field.

What are described above is related to the illustrative embodiments of the disclosure only and not limitative to the scope of the disclosure; the scopes of the disclosure are defined by the claims.

The present application claims the priority of the Chinese Patent Application No. 201710308737.3 filed on May 4, 2017, which is incorporated herein by reference as part of the disclosure of the present application.

What is claimed is:

1. A fabrication method of a thin film transistor, comprising:
   providing a base substrate;
   forming a gate electrode, an active layer, a source electrode, and a drain electrode on the base substrate, wherein the active layer comprises a channel region and a second portion on both sides of the channel region, and at least a portion of the channel region is overlapped with the gate electrode;
   performing a laser annealing process on a side of the base substrate by using a laser, wherein the channel region is shielded and not irradiated by the laser, and a resistivity of the second portion of the active layer is lower than a resistivity of the channel region because of the laser annealing process,
   wherein the second portion of the active layer is connected with the source electrode and the drain electrode; and
   forming an insulating layer on the source electrode and the drain electrode, wherein the laser annealing process is performed after the insulating layer is formed on the source electrode and the drain electrode.

2. The fabrication method of the thin film transistor according to claim 1, wherein the thin film transistor is a bottom-gate type thin film transistor, and the laser annealing process is performed on a side of the base substrate which is not provided with the active layer by using the gate electrode as a mask.

3. The fabrication method of the thin film transistor according to claim 1, wherein the thin film transistor is a bottom-gate type thin film transistor, and the fabrication method further comprises: forming a shielding layer that is overlapped with at least a portion of the channel region on a side of the active layer facing away from the base substrate, wherein the performing the laser annealing process comprises performing the laser annealing process on a side of the base substrate provided with the active layer by using the shielding layer as a mask.

4. The fabrication method of the thin film transistor according to claim 1, wherein the thin film transistor is a top-gate type thin film transistor, and the laser annealing process is performed on a side of the base substrate provided with the active layer by using the gate electrode as a mask.

5. The fabrication method of the thin film transistor according to claim 1, wherein the thin film transistor is a top-gate type thin film transistor, and the fabrication method further comprises: forming a shielding layer that is overlapped with at least a portion of the channel region on a side of the active layer facing the base substrate, wherein the performing the laser annealing process comprises performing the laser annealing process on a side of the base substrate which is not provided with the active layer by using the shielding layer as a mask.

6. The fabrication method of the thin film transistor according to claim 1, further comprising:
   forming an etching stop layer on the active layer before forming the source electrode and the drain electrode.

7. The fabrication method of the thin film transistor according to claim 1, wherein the laser annealing process is an excimer laser annealing process or a continuous oscillation laser annealing process.

8. The fabrication method of the thin film transistor according to claim 1, wherein an energy of the laser is from 100 $mj/cm^2$ to 300 $mj/cm^2$ during the performing the laser annealing process.

* * * * *